US008193568B2

(12) United States Patent
Bhattacharyya

(10) Patent No.: US 8,193,568 B2
(45) Date of Patent: *Jun. 5, 2012

(54) NANOCRYSTAL BASED UNIVERSAL MEMORY CELLS, AND MEMORY CELLS

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 114 days.

This patent is subject to a terminal disclaimer.

(21) Appl. No.: 12/815,109

(22) Filed: Jun. 14, 2010

(65) Prior Publication Data

US 2010/0295118 A1    Nov. 25, 2010

Related U.S. Application Data

(63) Continuation of application No. 11/872,130, filed on Oct. 15, 2007, now Pat. No. 7,759,715.

(51) Int. Cl.
*H01L 27/108* (2006.01)

(52) U.S. Cl. ........ 257/298; 257/296; 257/297; 257/325; 257/E29.345; 257/E29.309; 977/777; 977/943

(58) Field of Classification Search .................. 257/325, 257/298, 296, 297, E29.345, E29.309; 977/943
See application file for complete search history.

(56) References Cited

U.S. PATENT DOCUMENTS

| 4,870,470 | A | 9/1989 | Bass, Jr. et al. |
|---|---|---|---|
| 5,937,295 | A | 8/1999 | Chen et al. |
| 6,784,480 | B2 | 8/2004 | Bhattacharyya |
| 6,888,200 | B2 | 5/2005 | Bhattacharyya |
| 7,005,697 | B2 | 2/2006 | Batra et al. |
| 7,012,297 | B2 | 3/2006 | Bhattacharyya |
| 7,158,410 | B2 | 1/2007 | Bhattacharyya et al. |
| 7,166,888 | B2 | 1/2007 | Bhattacharyya |
| 7,209,389 | B2 | 4/2007 | Lung |
| 7,250,653 | B2 | 7/2007 | Kim et al. |
| 7,393,745 | B2 | 7/2008 | Jeng |

(Continued)

FOREIGN PATENT DOCUMENTS

EP    1480274    11/2004

(Continued)

OTHER PUBLICATIONS

CH. Sarentis et al. "Deposition and Electrical Characterisation of a MOS Memory Structure Containing AU Nanoparticles in a High-K Dielectric Layer" Supplied by the British Library "The world's knowledge" © 2005 IEEE.

(Continued)

*Primary Examiner* — Bradley K Smith
*Assistant Examiner* — Mohammad T Karimy
(74) *Attorney, Agent, or Firm* — Wells St. John P.S.

(57) ABSTRACT

Some embodiments include memory cells that contain a dynamic random access memory (DRAM) element and a nonvolatile memory (NVM) element. The DRAM element contains two types of DRAM nanoparticles that differ in work function. The NVM contains two types of NVM nanoparticles that differ in trapping depth. The NVM nanoparticles may be in vertically displaced charge-trapping planes. The memory cell contains a tunnel dielectric, and one of the charge-trapping planes of the NVM may be further from the tunnel dielectric than the other. The NVM charge-trapping plane that is further from the tunnel dielectric may contain larger NVM nanoparticles than the other NVM charge-trapping plane. The DRAM element may contain a single charge-trapping plane that has both types of DRAM nanoparticles therein. The memory cells may be incorporated into electronic systems.

15 Claims, 12 Drawing Sheets

U.S. PATENT DOCUMENTS

| | | |
|---|---|---|
| 7,759,715 B2 | 7/2010 | Bhattacharyya |
| 2006/0110870 A1 | 5/2006 | Bhattacharyya |
| 2006/0131633 A1 | 6/2006 | Bhattacharyya |
| 2006/0192240 A1 | 8/2006 | Bhattacharyya |
| 2006/0192243 A1 | 8/2006 | Bhattacharyya |
| 2006/0202251 A1 | 9/2006 | Bhattacharyya |
| 2006/0205132 A1 | 9/2006 | Bhattacharyya |
| 2006/0258090 A1 | 11/2006 | Bhattacharyya et al. |
| 2007/0034922 A1 | 2/2007 | Bhattacharyya |
| 2007/0034930 A1 | 2/2007 | Bhattacharyya |
| 2007/0045706 A1 | 3/2007 | Bhattacharyya et al. |
| 2007/0045711 A1 | 3/2007 | Bhattacharyya et al. |
| 2007/0045718 A1 | 3/2007 | Bhattacharyya |
| 2007/0045719 A1 | 3/2007 | Wang et al. |
| 2007/0048926 A1 | 3/2007 | Ahn et al. |
| 2007/0052011 A1 | 3/2007 | Bhattacharyya |
| 2007/0132010 A1 | 6/2007 | Bhattacharyya |
| 2008/0057690 A1 | 3/2008 | Forbes et al. |
| 2008/0121962 A1 | 5/2008 | Forbes et al. |
| 2008/0268605 A1 | 10/2008 | Ahn et al. |

FOREIGN PATENT DOCUMENTS

| | | |
|---|---|---|
| JP | 2004-349705 A | 12/2004 |
| KR | 10-2007-0014593 | 2/2007 |
| WO | PCT/US2008/077383 | 4/2009 |
| WO | PCT/US2008/077383 | 4/2010 |

OTHER PUBLICATIONS

Jin Lee Jong et al. "Dielectric Engineering in Nanocrystal Memory Devices for Improved Programming Dynamics" IEEE, Physics Symposium, San Jose 2005.

Xuguang Wang et al. "A Novel MONOS-Type Nonvolatile Memory Using High-K Dielectrics for Improved Data Retention and Programming Speed" IEEE Transactions on Electron Devices, vol. 51, No. 4 Apr. 2004 pp. 597-602.

Jan Van Houdt "High-K Materials for Nonvolatile Memory Applications" IEEE, Physics Symposium, San Jose 2005 pp. 234-239.

Josef Willer et al. "110 nm NROM Technology for Code and Data Flash Products" Jul. 2004 Symposium on VLSI Technology Digest of Technical Papers pp. 76-77.

Sandip Tiware et al. "Volatile and Non-Volatile Memories in Silicon with Nano-Crystal Storage" IEEE © 1995 IEDM 95-521 through IEDM 95-524.

S. Okhonin et al. "A SOI Capacitor-less 1T-DRAM Concept" 2001 IEEE International SOI Conference Jan. 2001, pp. 153-154.

Takashi Ohsawa et al. "Memory Design Using One-Transistor Gain Cell on SOI" ISSCC Feb. 5, 2002/Session 9/DRAM and Ferroelectric Memories/9.1.

Shieun Kim, et al. "Robust Multi-bit Programmable Flash Memory Using a Resonant Tunnel Barrier" IEEE © Aug. 2005.

S. Lombardo et al. "Distribution of the Threshold Voltage Window in Nanocrystal Memories with Si Dots Formed by Chemical Vapor Deposition: Effect of Partial Self-Ordering" reprinted Jun. 6, 2007.

T.C. Chang et al. "Quasisuperlattice storage: A concept of multilevel charge storage" American Institute of Physics, Applied Physics Letters, vol. 85, No. 2, Jul. 12, 2004 pp. 248-250.

Jiun-Yi Tseng et al. "Memory characteristics of Pt nanocrystals self-assembled from reduction of an embedded PtOx ultrathin film in metal-oxide-semiconductor structures" American Institute of Physics, Applied Physics Letters, vol. 85, No. 13, Sep. 27, 2004, pp. 2595-2597.

Seung-Hyun-Lim et al. "Nonvolatile MOSFET memory based on high density WN nanocrystal layer fabricated by novel PNL (Pulsed Nucleation Layer) method" 2005 Symposium on VLSI Technology Digest of Technical Papers, pp. 190-191.

S.K. Samanta et al. "Enhancement of Memory Window in Short Channel Non-Volatile Memory Devices Using Double Layer Tungsten Nanocrystals" IEEE © 2005, 4 pages.

K.W. Guarini et al. "Low voltage, scalable nanocrystal FLASH memory fabricated by templated self assembly" IEEE, © 2003, IEDM 03-541 through IEDM 03-544.

Shan Tang et al. "Nanocrystal Flash Memory Fabricated with Protein-mediated Assembly" Microelectronics Research Center, The University of Texas at Austin. Downloaded Jun. 4, 2007, 4 pages.

Konstantin K. Likharev "Riding the Crest of a New Wave in Memory" NOVORAM: A New Concept for Fast, Bit-Addressable Nonvolatile Memory Based on Crested Barriers Circuits & Devices, Jul. 2000, pp. 16-21.

B. Govoreanu et al. "A Figure of Merit for Flash Memory Multi-Layer Tunnel Dielectrics" pp. 270-273 reprinted Jun. 6, 2007.

B. Govoreanu et al. "VARIOT: A Novel Multilayer Tunnel Barrier Concept for Low-Voltage Nonvolatile Memory Devices" IEEE Electron Device Letters, vol. 24, No. 2, Feb. 2003 pp. 99-101.

Jing Hao Chen, "Nonvolatile Flash Memory Device Using Ge Nanocrystals Embedded in HfA1O High-K Tunneling and Control Oxides: Device Fabrication and Electrical Performance" IEEE Transactions on Electron Devices, vol. 51, No. 11, Nov. 2004, pp. 1840-1848.

Rohit Gupta et al. "Formation of SiGe nanocrystals in HfO2 using in situ chemical vapor deposition for memory applications" Applied Physics Letters, vol. 84, No. 21, May 24, 2004, pp. 4331-4333.

C. Monzio et al. "Study of data retention for nanocrystal Flash memories" Physics Symposium, Dallas, Texas, 2003, pp. 506-512.

Chungho Lee et al. "Operational and Reliability Comparison of Discrete-Storage Nonvolatile Memories: Advantages of Single- and Double-Layer Metal Nanocrystals" IEDM 03-557 through IEDM 03-560 May 2003.

M. Takata et al. "New Non-Volatile Memory with Extremely High Density Metal Nano-Dots" IEEE © May 2003, IEDM 03-553 through IEDM 03-556.

Mitsu Koyanagi et al. "Metal Nano-Dot Memory for High-Density Non-Volatile Memory Application" IEEE © 2004, pp. 885-889.

Chungho Lee et al. "Metal nanocrystal/nitride heterogeneous-stack floating gate memory" IEEE © 2005 pp. 97-98.

Min She et al. "Improved SONOS-type Flash Memory using HfO2 as Trapping Layer" Department of Electrical Engineering and Computer Sciences, UC Berkley http://www.eecs.berkeley.edu/~takeuchi/paper/HfO2_memory.pdf.

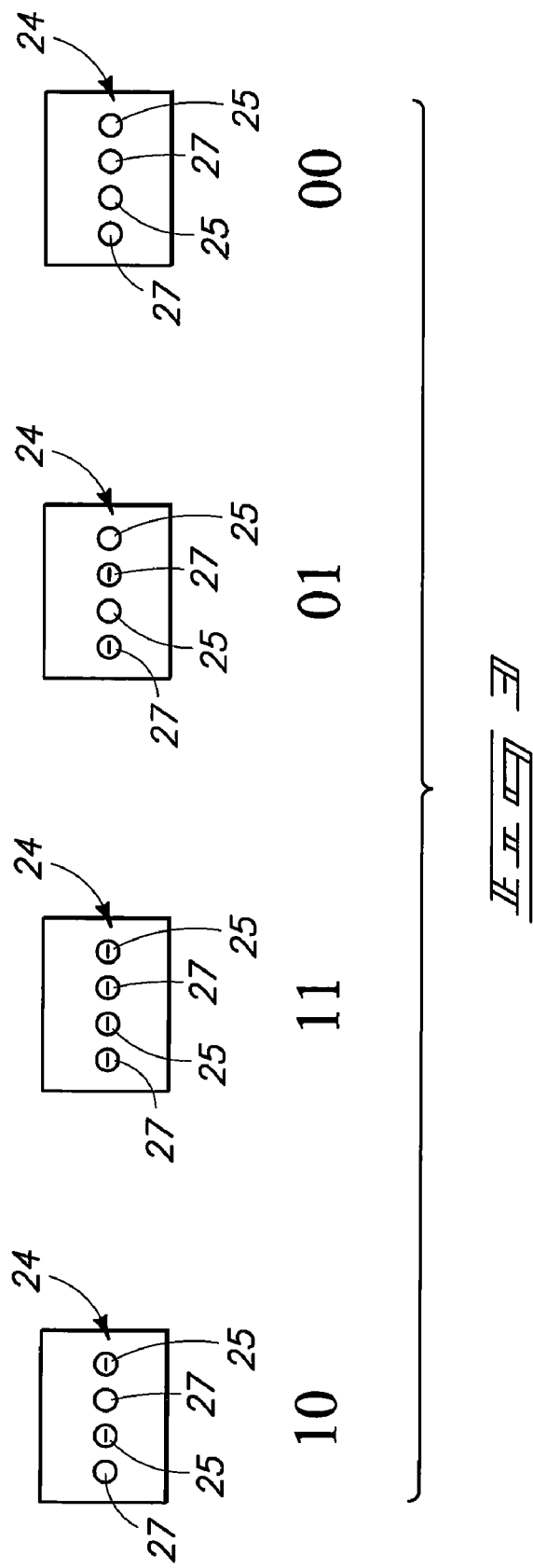

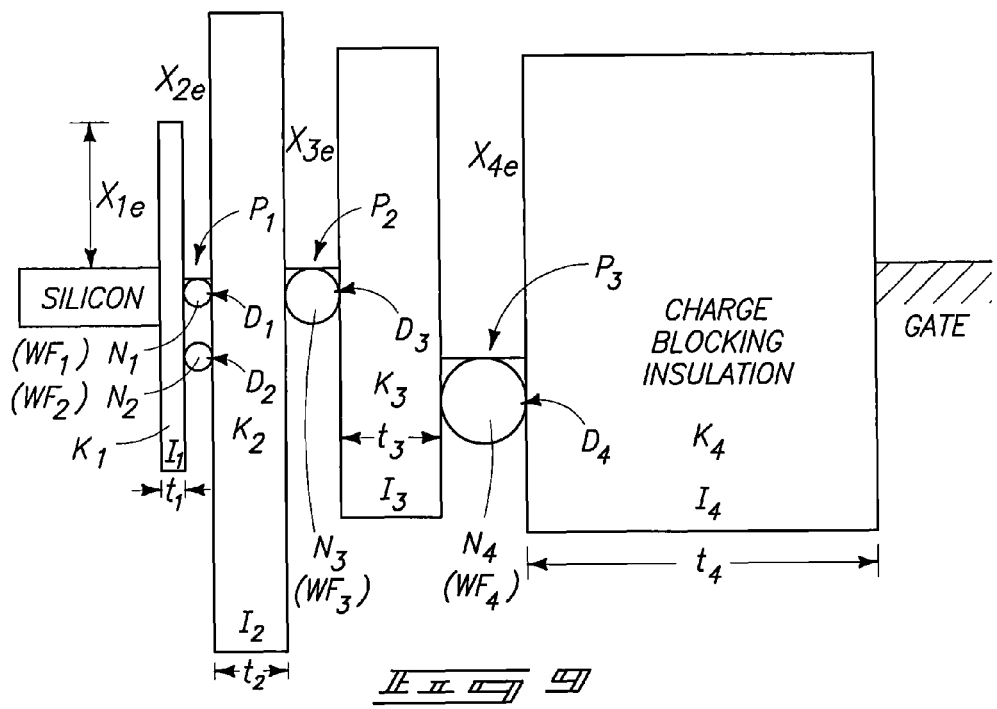
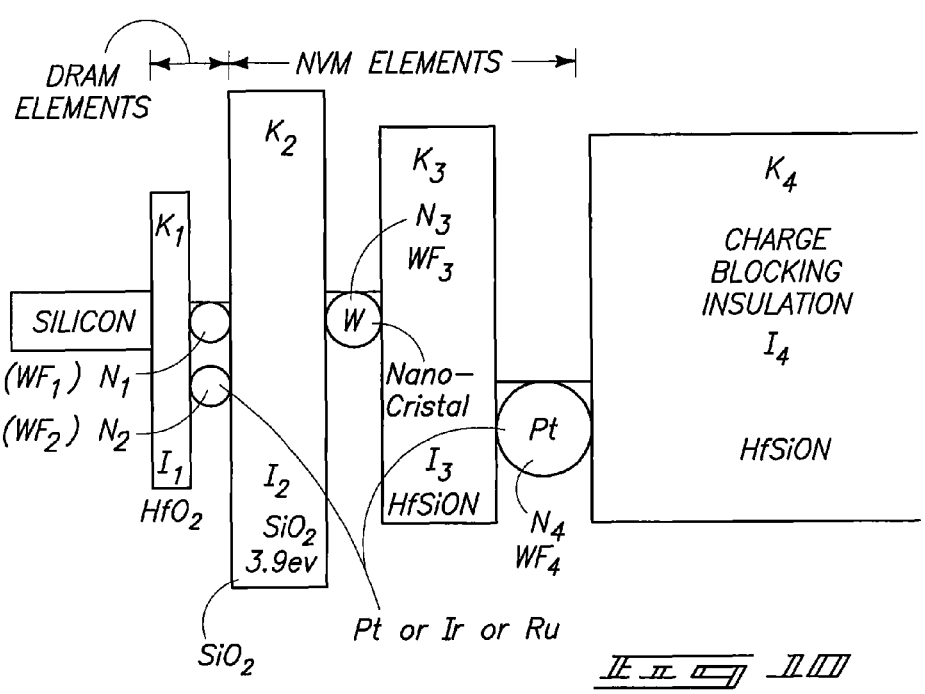

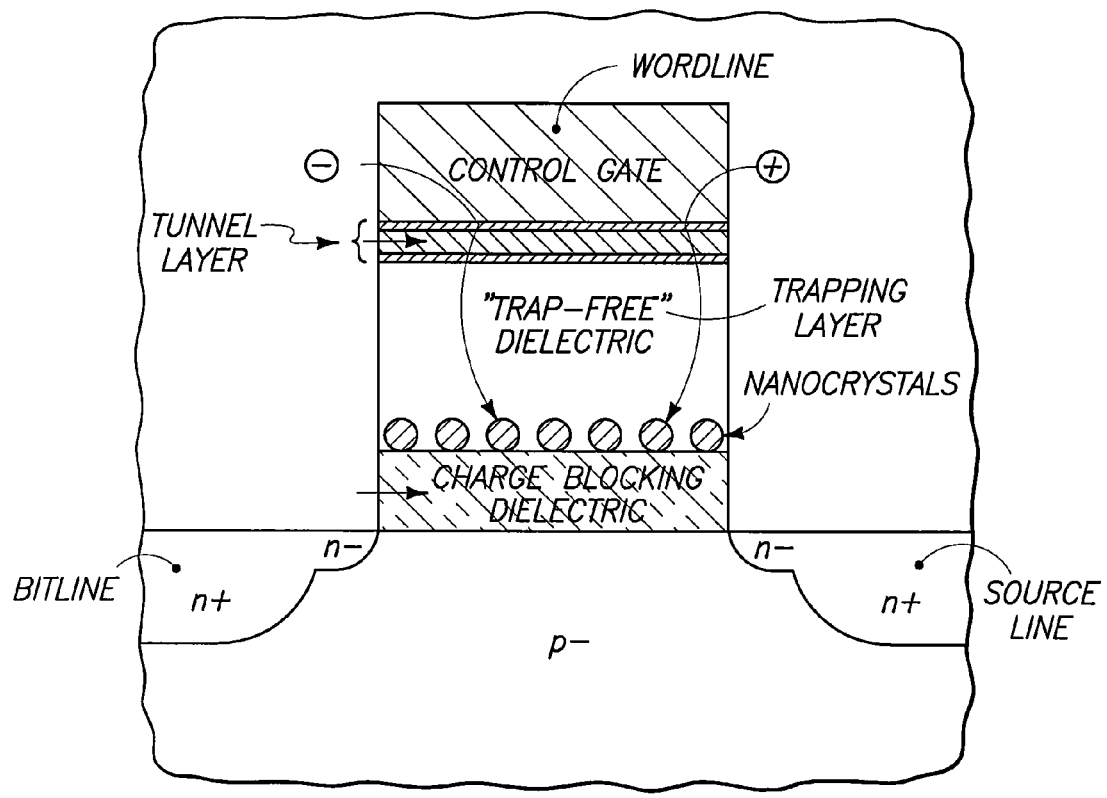

NANOCRYSTAL BASED UNIVERSAL MEMORY CELLS, AND MEMORY CELLS

RELATED PATENT DATA

This patent resulted from a continuation of U.S. patent application Ser. No. 11/872,130, which was filed Oct. 15, 2007, and which is hereby incorporated herein by reference.

TECHNICAL FIELD

Memory cells, and in some embodiments, nanocrystal based universal memory cells.

BACKGROUND

Memory cells provide data storage for electronic systems.

One type of memory is dynamic random access memory (DRAM). DRAM is dynamically accessible. In DRAM, memory is stored for a short period of time—typically less than a second, and accordingly DRAM requires periodic refreshing. DRAM loses memory when power fails, and accordingly is volatile. DRAM may be accessed and altered quickly.

Another type of memory is static random access memory (SRAM). SRAM may be accessible faster than DRAM, may store memory permanently as long as power is present, and thus may not require refreshing like DRAM. SRAM, like DRAM, loses memory when power is off, and accordingly is also volatile.

While DRAM traditionally utilizes unit cells containing a transistor and a capacitor, SRAM unit cells comprise six transistors, and therefore the cell size for SRAM is much larger than that for DRAM. In high-performance electronic systems, SRAM may be used for instruction storage, while DRAM is used for working memory and short-term data storage. Permanent instructions and data may be stored in DISCs, which are large, bulky, and relatively slow in performance.

Capacitor-less DRAM is becoming increasingly common. In capacitor-less DRAM, charge storage is accomplished without a capacitor, and may, for example, be accomplished utilizing a floating body.

For portable electronics which do not require ultra-high-speed alteration of data and instruction, another type of memory that may be utilized is nonvolatile memory (NVM). NVM is memory which stores data without refreshing, and accordingly memory suitable for storing data for substantial lengths of time (for instance, 10 years) in the absence of power.

NVM unit cells may be random accessible similar to DRAM or SRAM, and may be called NROM or EEPROM when organized in a NOR configuration. An NROM cell may consist of a single transistor unit and have a cell size about half of that of conventional DRAM. NROM may be utilized for storage of instructions.

Another type of NVM may be configured in a NAND configuration, and such may be even smaller than the NROM cell. The NAND configuration NVM may be called NAND-NVM and may be utilized for data storage. NAND-NVM may be accessed serially within a string of 32 cells, and may be slower than NROM.

Memory stored in NVM may be accessed nearly as fast as DRAM or SRAM, and may, for example, be accessed at rates of from about one nanosecond to about 30 nanoseconds. However, writing data or structures into NVM cells may be slower than writing to DRAM or SRAM by many orders of magnitude. For instance, while DRAM cells may be written or erased at from about 10 nanoseconds to about 50 nanoseconds, NVM cells are typically written or erased in the range of from about 100 microseconds to about 10 milliseconds. Additionally, NVM cells may be limited in endurance relative to DRAM or SRAM (in other words, may be limited relative to the number of write/erase cycles that can be performed). Endurance for conventional NVM cells may be about 10 million cycles, while DRAM and SRAM may have nearly infinite endurance (in other words, may have endurance that exceeds the practical lifetime of the electronic system utilizing the DRAM or SRAM). Additionally, NVM cells may require higher voltage to write/erase than DRAM and/or SRAM, with NVM cells utilizing 10 volts to 20 volts, while DRAM and/or SRAM cells may operate at power supply voltage levels of from about 1.5 volts to about 2.5 volts.

The distinction between volatile devices and nonvolatile devices is somewhat subjective. NVM is seldom totally nonvolatile, and accordingly there will be some leakage and loss of data from NVM over long time periods, particularly in environments with substantial heat. Further, a trend is to reduce the amount of refresh required for DRAM in order to reduce power consumption. For the purposes of interpreting this disclosure, NVM means memory that stores data for at least 24 hours at room temperature (about 22° C.) without refresh, and volatile memory, such as DRAM, is memory that requires refresh to store data in time intervals of less than a second during application at room temperature. The storage of data for 24 hours at room temperature is a very minimal tolerance for NVM utilized for distinguishing nonvolatile memory from volatile memory for interpreting this disclosure. In actual applications, NVM may store data without refresh for much longer periods of time, and may, for example, store data for at least about 10 years without refresh.

An example NVM-NAND is flash memory. A flash memory is a type of EEPROM (electrically-erasable programmable read-only memory) that may be erased and reprogrammed in blocks.

Many modern personal computers have BIOS stored on a flash memory chip. Such a BIOS is sometimes called a flash BIOS. Flash memory is also popular in wireless electronic devices because it enables the manufacturer to support new communication protocols as they become standardized, and to provide the ability to remotely upgrade the device for enhanced features.

NOR and NAND are two basic architectures of flash memory. While NOR is random accessible, NAND is currently accessible with strings of 32 bits. Each string may, however, be random accessible. Both NOR-NVM (NROM) and NAND-NVM may be made such that unit cells store single bits or multiple bits. When unit cells are used for single bits of storage, they are referred to as single level cells (SLCs), and when unit cells store multiple bits they are referred to as multilevel cells (MLCs). Manufacturers are transitioning from one bit of storage to two bits of storage per unit cell to double storage capacity. Accordingly, manufacturers are transitioning from SLC-type cells to MLC-type cells. While an SLC device utilizes only two memory states (0 or 1), MLCs may utilize four memory states for storage of two bits of data (00, 01, 10 and 11), eight memory states for three bits of storage, and so on. Accordingly, flash MLC memory cells utilize larger memory windows than flash SLC cells, and differ in programming and addressing requirements.

Both DRAM and NVM offer advantageous and disadvantages. DRAM is fast, but the volatility of DRAM leads to data loss once power is turned off, and the refreshing of DRAM consumes power. NVM is stable in the absence of power, but tends to be slower to program than DRAM. Also, NVM often utilizes higher programming voltages than DRAM, which lowers the endurance of NVM relative to DRAM.

A continuing goal of semiconductor fabrication is to decrease the amount of semiconductor real estate consumed by individual devices, to thereby enable increasing the level of integration of devices.

As the feature size is reduced below 60 nanometers, both volatile memories (for instance, DRAM and SRAM) and nonvolatile memories face various scalability challenges. Scalability challenges common to volatile and nonvolatile memories include short channel effects. Various three-dimensional configurations, thin body substrate constructions (surround gates, finFETs, fully depleted SOI substrates, etc.) have been proposed to address such short channel effects. For conventional DRAM cells, the scalability challenge may also include difficulties associated with reducing the size of the capacitor, and accordingly capacitor-less DRAM has been suggested. For floating gate flash cells, parasitic coupling between adjacent cells during high voltage write/erase operations may also be an issue to be addressed during scaling of the cells. The problem of parasitic coupling may be aggravated by MLC requirements. In order to lower programming voltage, and yet preserve 10 years of charge retention in the absence of power, it has been suggested to replace floating gates of flash devices with floating traps (either SONOS or nanocrystals). These types of devices, especially the nanocrystal embedded charge storage devices, may utilize thinner tunnel insulator in the gate stack, and therefore may utilize lower programming voltages. Replacement of thicker floating gate over-layer insulator (typically oxide or oxide-nitride-oxide) with high dielectric constant insulator (K>10) may further reduce programming voltage.

Additional scalability challenges for flash may be associated with the large memory windows utilized for MLC operation in conjunction with desires to decrease geometry and associated reduction in trapping capacity, threshold dispersion at time-zero due to write/erase cycling, and reliability issues associated with some types of "exotic" dielectric materials being incorporated into the flash devices.

A universal memory may be defined as a memory which addresses functional and application limitations of DRAM, SRAM, NVM and DISC memory storage devices. A universal memory may possess several of, or all of the following attributes: (1) 10 years of memory retention with or without power (nonvolatility); (2) greater than $10^{13}$ cycles of endurance; (3) write/erase speed faster than 100 nanoseconds, and in some embodiments in the range of 10 nanoseconds to 100 nanoseconds; (4) write/erase voltage less than four-times the power supply voltage; (5) cell size less than or equal to $4F^2$ (where "F" is the minimum feature size of the operation utilized to build the cell); and (6) no fundamental scalability limitations. Additionally, it may be desired that the universal memory have low power requirements, and be readily integrated into multi-functional electronic devices and storage systems.

A continuing goal of semiconductor technology is to decrease the amount of semiconductor real estate consumed by multiple types of memory devices, and to thereby reduce costs, power requirements, and interface complexity. Such may enable higher levels of functional integration and new applications. It is thus desired to develop devices, such as universal memory cells and associated structures and processes by which simultaneous advantages of DRAM and NVM (including DISC application) may be realized.

BRIEF DESCRIPTION OF THE DRAWINGS

FIG. 3 diagrammatically illustrates MLC states of a DRAM element of a memory cell in accordance with an embodiment.

FIG. 4 diagrammatically illustrates MLC states of an NVM element of a memory cell in accordance with an embodiment.

FIGS. 9-11 are an energy band diagrams of example embodiments.

FIG. 13 is a graph illustrating an example method of programming a memory cell.

FIG. 14 is a diagrammatic, cross-sectional view of a portion of a semiconductor construction illustrating an embodiment of a memory cell.

DETAILED DESCRIPTION OF THE ILLUSTRATED EMBODIMENTS

In some embodiments, memory devices include multiple vertically-stacked charge-trapping zones over a tunnel dielectric. The charge-trapping zone closest to the tunnel dielectric may comprise two different types of nanoparticles either placed in a single dielectric plane or in multiple dielectric planes, and may be utilized for DRAM (in other words, a volatile memory (VM) element). Charge-trapping zones over that utilized for DRAM may be utilized for nonvolatile memory (NVM), and such NVM zones may consist of a single plane, or may comprise multiple planar structures with embedded nanoparticles.

In some embodiments, a single memory cell may comprise both a DRAM element and an NVM element. In some embodiments, one or both of the DRAM element and the NVM element may be suitable for storing single memory bits and accordingly be suitable for SLC-type applications. In some embodiments, one or both of the DRAM element and the NVM element may be suitable for storing multiple memory bits, and accordingly suitable for MLC-type applications.

In some embodiments, the DRAM element may be utilized for rapid access memory, and the data stored in the DRAM element may be shifted to the NVM element for stable storage. In some embodiments, the DRAM element and the NVM element of an individual memory cell may be utilized entirely independently of one another so that data stored in the NVM element has no relation to the data in the DRAM element of the memory cell.

A memory cell comprising both a DRAM element and an NVM element may be referred to as a universal memory cell, in that it encompasses the speed advantages of DRAM together with the stable data storage advantages of NVM.

Figure 1:
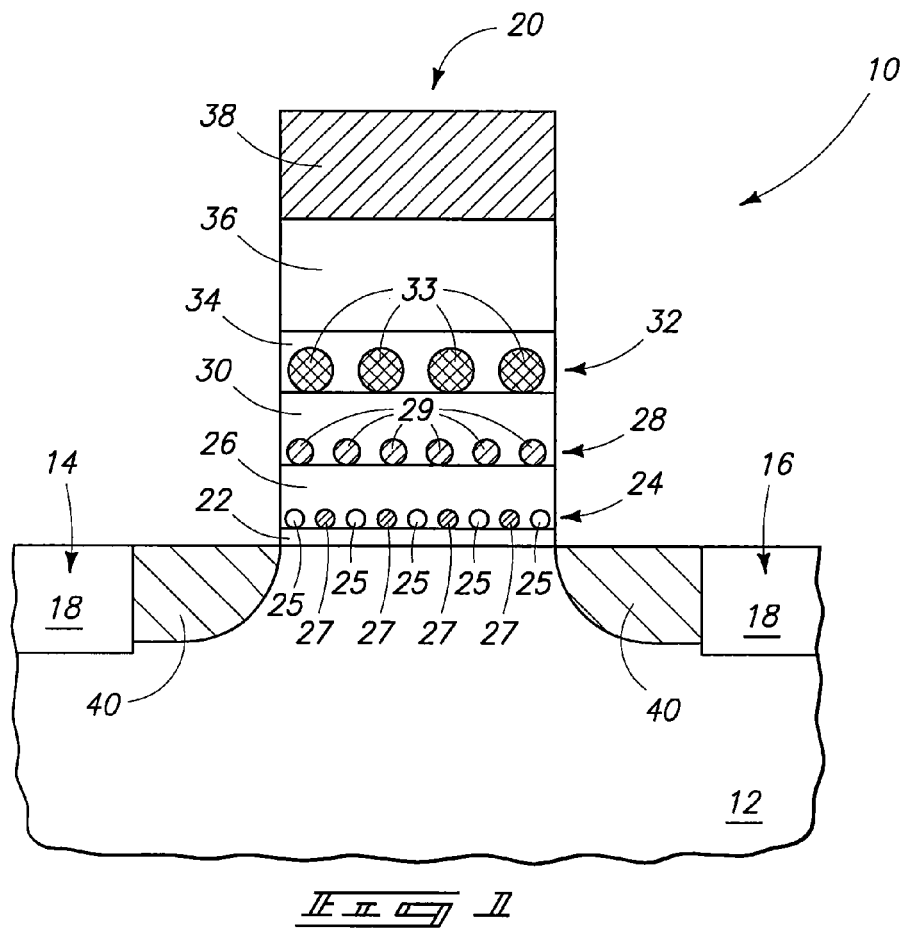
FIG. 1 is a diagrammatic, cross-sectional view of a portion of a semiconductor construction illustrating an embodiment of a memory cell.

An example embodiment memory cell 20 is shown in FIG. 1 as part of a semiconductor construction 10.

The semiconductor construction 10 includes a base 12. Such base may comprise semiconductor material, such as, for example, monocrystalline silicon. The base may be referred to as a semiconductor substrate in some embodiments, and in other embodiments may be referred to as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Although base 12 is shown to be homogenous, the base may comprise numerous layers in some embodiments. For instance, base 12 may correspond to a semiconductor substrate containing one or more layers associated with integrated circuit fabrication. In such embodiments, such layers may correspond to one or more of metal interconnect layers, barrier layers, diffusion layers, insulator layers, etc. As another example, base 12 may correspond to semiconductor material formed over a layer of electrically insulative material (for instance, silicon dioxide) as part of a semiconductor-on-insulator (SOI) construction.

A pair of isolation regions 14 and 16 extend into base 12. The isolation regions may correspond to shallow trench isolation regions. The isolation regions comprise material 18. Such material may comprise any suitable composition or combination of compositions, and may, for example, comprise, consist essentially of, or consist of one or both of silicon dioxide and silicon nitride.

Memory cell 20 comprises, in ascending order from base 12, a tunnel dielectric 22, a first charge-trapping zone 24, a first body dielectric 26, a second charge-trapping zone 28, a second body dielectric 30, a third charge-trapping zone 32, a third body dielectric 34, a blocking dielectric 36 and a control gate 38.

The charge-trapping zones 24, 28 and 32 are vertically stacked relative to one another. The charge-trapping zone 24 may be part of a DRAM element of the memory cell, and the charge-trapping zones 28 and 32 may be part of an NVM element of the memory cell.

The charge-trapping zone 24 comprises a plurality of nanoparticles which are shown as electrically conductive spheres embedded within a portion of dielectric 26. The nanoparticles may have any suitable shape, and in some embodiments may comprise shapes other than the shown spherical shape. In embodiments in which the nanoparticles are substantially spherical, such nanoparticles may be referred to as nanodots. Nanoparticles may be structures less than or equal to about 100 nanometers along a maximal cross-section. Frequently, the nanoparticles will be less than 10 nanometers, or even less than 3 nanometers along a maximal cross-section. In some embodiments, the nanoparticles may be nanodots having a diameter of from about 0.5 nanometers to about 100 nanometers. The nanodots may be configured to trap less than or equal to about 20 charges, and may, for example, be configured to trap from about 1 charge to about 20 charges. In some embodiments, the nanoparticles of charge-trapping zone 24 may be referred to a discrete islands.

The charge-trapping zone 24 may be referred to as a DRAM charge-trapping zone in some embodiments. The DRAM charge-trapping zone in this embodiment comprises two different types of nanoparticles, with the nanoparticles of one type being labeled 25, and the nanoparticles of the other type being labeled 27. The two DRAM nanoparticle types are shown to be interspersed with one another, but in other embodiments may be segregated and/or separated into non-interspersed regions. The charge-trapping zone 24 corresponds to a single plane of nanoparticles 25 and 27 in the shown embodiment. However, in other embodiments the charge trapping zone may comprise multiple planes of nanoparticles 25 and 27.

The DRAM nanoparticles 25 and 27 differ from one another in work function, and may differ in one or more of composition, size, density and distribution. The nanoparticles may comprise any suitable compositions, and in some embodiments the nanoparticles 25 and 27 may comprise, consist essentially of, or consist of one or more of Au, Ag, Co, conductively-doped Ge, Ir, Ni, Pd, Pt, Re, Ru, conductively-doped Si, Si—Ge, Ta, Te, Ti and W. In some embodiments, one type of the nanoparticles (25 or 27) will comprise, consist essentially of, or consist of tungsten and the other type will comprise, consist essentially of, or consist of platinum. This enables the two DRAM nanoparticle types to be separately charged relative to one another during reading to and writing from the DRAM element, as will be discussed in more detail below.

The charge-trapping zones 28 and 32 may be referred to as NVM charge-trapping zones. The charge-trapping zones 28 and 32 comprise nanoparticles 29 and 33, respectively. The nanoparticles 29 and 33 may comprise any suitable compositions, and in some embodiments may comprise, consist essentially of, or consist of one or more of Au, Ag, Co, conductively-doped Ge, Ir, Ni, Pd, Pt, Re, Ru, conductively-doped Si, Si—Ge, Ta, Te, Ti and W. The nanoparticles 29 and 33 may be considered to correspond to first and second types of NVM nanoparticles, respectively. The charge-trapping zone 28 corresponds to a plane of nanoparticles 29 in the shown embodiment, and the charge-trapping zone 32 corresponds to a plane of nanoparticles 33 in the shown embodiment.

The nanoparticles 29 and 33 may differ in trapping energy relative to one another. Such may be accomplished by having nanoparticles 29 differ from nanoparticles 33 in one or more of composition, size and density. In some embodiments, nanoparticles 33 will be larger than nanoparticles 29. More specifically, the NVM nanoparticles 29 form a first population having a first average cross-sectional dimension, and the NVM nanoparticles 33 form a second population having a second average cross-sectional dimension which is larger than the first average cross-sectional dimension. In other embodiments, nanoparticles 33 will be of similar composition, size and density as nanoparticles 29. In other embodiments, single NVM charge trapping zones with multiple nanoparticles 29 and 33 may be utilized. The nanoparticles 29 and 33 may be interspersed with one another, or may be segregated, separated, or otherwise distributed into non-interspersed regions. In some embodiments, multiple NVM charge trapping zones with single compositions of nanoparticles may be utilized. If the nanoparticles are substantially spherical nanodots, the first and second average cross-sectional dimensions may be average diameters of the nanodots 29 and 33. The second average cross-sectional dimension may be larger than the first average cross-sectional dimension by any amount suitable for a particular application, and in some embodiments may be at least about 10% larger than the first average cross-sectional dimension. In some embodiments, the nanoparticles of charge-trappings zones 28 and 32 may be referred to a discrete islands.

Trapping energy associated with individual nanodots, and the amount of charge retained on individual nanodots, may be related to the size of the nanodots and to the composition of the nanodots. Specifically, smaller nanodots of the same composition as larger nanodots may have shallower charge traps than the larger nanodots, and may retain less charge. The changes in trap depth and amount of retained charge may result from quantum confinement and coulomb blockade, at least when the nanodots have a diameter of from about 0.5 nanometer to about 10 nanometers.

Quantum confinement describes how the electronic properties—the organization of energy levels into which electrons can climb or fall—change when a nanoparticle is sufficiently small in size. This size is typically 10 nanometers or less. Specifically, the phenomenon results from electrons and holes being squeezed into a dimension that approaches a critical quantum measurement, called the "exciton Bohr radius." The larger the particle size, the lower the ground state and, therefore, the longer the charge can be retained. The smaller the particle size, the more easily the electron stays in a shallow energy level so that it can come out more readily.

Coulomb blockade is the suppression of current, at low bias, due to the discreteness of an elementary charge. A nanoparticle becomes a charge center when it attracts a charge. A nanoparticle can capture multiple electrons. Every time an electron is captured, the electrostatic field around the nanoparticle builds up to the point where it repels other electrons. At this point, any more incoming electrons come in at a higher energy state that allows them to leak out. Therefore, the more electrons that are captured, the lower the charge retention time.

By placing increasingly larger nanodots within the charge-trapping zones as the charge-trapping zones are further from the tunnel dielectric 22 and substrate 12, the charge-trapping zones further from the tunnel dielectric end up with deeper traps than the charge-trapping zones nearer the tunnel dielectric, and at the same time require longer tunnel distances for charges to travel from substrate 12. This enables the two NVM charge-trapping zones 28 and 32 to be separately charged relative to one another during reading to and writing from the NVM element, as will be discussed in more detail below.

The change in trapping energy of the charge-trapping zones further from the tunnel dielectric relative to the charge-trapping zones nearer the tunnel dielectric may be enhanced by utilizing higher work function materials for the nanodots of the charge-trapping zones further from the tunnel dielectric 22 relative to the materials utilized for the nanodots of the charge-trapping zones nearer the tunnel dielectric 22. In some embodiments, nanoparticles 29 comprise, consist essentially of, or consist of tungsten, and nanoparticles 33 comprise, consist essentially of, or consist of platinum.

The individual nanodots in the charge-trapping zones 24, 28 and 32 may be spaced from one another by at least about 3.5 nanometers to avoid cross-talk between adjacent nanodots. If the spacing between adjacent nanodots is about the same within the various charge-trapping zones, then the zones with the smaller nanodots will have a higher density of nanodots than the zones with the larger nanodots.

The tunnel dielectric 22 of memory cell 20 may comprise any suitable composition or combination of compositions, and may, for example, comprise, consist essentially of, or consist of one or more of silicon dioxide, transition metal oxides (for instance hafnium oxide and zirconium oxide), and various lanthanide oxides (with the term "lanthanide" referring to any of the elements having atomic number 57-71; and specifically to any of La, Ce, Pr, Nd, Pm, Sm, Eu, Gd, Tb, Dy, Ho, Er, Tm, Yb, and Lu). The tunnel dielectric material may be formed to an equivalent oxide thickness of from about 1 nanometer to about 4 nanometers (with the terms "equivalent oxide thickness" and "effective oxide thickness" meaning a thickness having the equivalent dielectric as the stated thickness of silicon dioxide).

The body dielectric materials 26, 30 and 34 may comprise any suitable compositions or combination of compositions, and may be the same as one another or different. In some embodiments, at least one of the dielectric materials 26, 30 and 34 will comprise high-k dielectric material (with high-k dielectric material being dielectric material having a dielectric constant greater than that of silicon dioxide). At least a portion of the high-k dielectric material may be charge-trapping material, such as silicon nitride; and the high-k dielectric material may thus supplement the charge-trapping characteristics of the charge-trapping zones.

In some embodiments, at least one of the dielectric materials 26, 30 and 34 will consist of dielectric material that is not charge trapping.

In some embodiments, the body dielectric material directly over the DRAM charge-trapping zone (the body dielectric material 26 in the shown embodiment) will consist of high-k dielectric material that is not charge trapping. For instance, such dielectric material may comprise, consist essentially of, or consist of one or more of lanthanide oxides, lanthanide oxynitrides, hafnium oxide, aluminum oxide, hafnium aluminum oxide, hafnium silicate, hafnium silicon oxynitride, zirconium silicon oxynitride, zirconium silicate and zirconium oxide. An example lanthanide oxynitride is PrON (shown in terms of the constituent elements, rather than in terms of a stoichiometry). The PrON may comprise about 40 atom percent Pr, from about 10 atom percent to about 20 atom percent 0, and from about 30 atom percent to about 50 atom percent N. For instance, the PrON may comprise about 40 atom percent Pr, about 20 atom percent 0, and about 40 atom percent N. In some embodiments, the dielectric material 26 may comprise silicon dioxide or other materials having dielectric constants less than or equal to that of silicon dioxide.

In some embodiments, the dielectric materials directly over the NVM charge-trapping regions (the dielectric materials 30 and 34 in the shown embodiment) may comprise, consist essentially of, or consist of one or more of silicon nitride, silicon-rich silicon oxynitride, silicon dioxide, lanthanide oxides, lanthanide oxynitrides, hafnium oxide, aluminum oxide, hafnium aluminum oxide, hafnium silicate, hafnium silicon oxynitride, zirconium silicon oxynitride, zirconium silicate and zirconium oxide. In some embodiments, one or both of the dielectric materials 30 and 34 may comprise one or more materials having dielectric constants less than or equal to that of silicon dioxide.

The body dielectric materials may be formed to thicknesses of from about 0.5 nanometer to about 30 nanometers. In some embodiments, the body dielectric materials may be formed to thicknesses of from about one nanometer to about 10 nanometers of effective oxide thickness; and in some embodiments may be formed to from about one nanometer to about three nanometers of effective oxide thickness. In some embodiments, the tunnel dielectric 22 may be formed to a first equivalent oxide thickness, the spacing layer 26 to a second equivalent oxide thickness greater than the first equivalent oxide thickness, and the spacing layer 30 to a third equivalent oxide thickness greater than the second equivalent oxide thickness. In some embodiments, the second equivalent oxide thickness may be at least about 10% greater than the first equivalent oxide thickness, and the third equivalent oxide thickness may be at least about 10% greater than the second equivalent oxide thickness.

In some embodiments, the materials 26 and 30 may be considered spacing materials, in that they space vertically-displaced charge-trapping zones from one another.

In the shown embodiment, the nanoparticles 25 and 27 are embedded within a lower portion of material 26; the nanoparticles 29 are embedded within a lower portion of material 30, and the nanoparticles 33 are embedded within a lower portion of material 34. In other embodiments, the nanoparticles may be embedded within different dielectric materials than those formed directly over the nanoparticles.

The nanoparticles 25, 27, 29 and 33 may be formed by any suitable methods. For instance, the nanoparticles may be formed by annealing a film of nanoparticle material deposited by atomic layer deposition (ALD), to cause the film to break into separated islands. Alternatively, or additionally, the nanoparticles may be formed by deposition of a thin film (specifically, a film of thickness of from about 1 nanometer to about 1.2 nanometers) by e-beam evaporation. Alternatively, or additionally, the nanoparticles may be formed by co-sputtering metal with embedding insulator, by pulsed nucleation and/or by a templated self-assembly.

The blocking dielectric material 36 may comprise any of the compositions discussed above for the body dielectric materials 26, 30 and 34. Accordingly, the blocking dielectric material may comprise any of various high-k dielectric compositions, including, for example, one or more of aluminum oxide, hafnium silicon oxynitride (HfSiON—which is shown in terms of constituent elements rather than stoichiometry), hafnium oxide, zirconium silicon oxynitride and zirconium oxide. The blocking dielectric material will typically have a higher dielectric constant than the tunnel dielectric material. The blocking dielectric material may be formed to an effective oxide thickness of from about 2 nanometers to about 20 nanometers. In some embodiments, dielectric 34 may be omitted so that the blocking dielectric extends from the bottom of the control gate to the charge-trapping zone 32.

The control gate 38 may comprise any suitable composition or combination of compositions. For instance, the control gate may comprise one or more of various metals (for instance, tungsten, titanium, etc.), metal-containing compositions (for instance, metal silicides, metal nitride, etc.) and conductively-doped semiconductor materials (for instance, conductively-doped silicon, etc.). In some embodiments, the control gate may comprise a metal nitride passivation layer directly against the blocking dielectric material, and may comprise doped semiconductor material over the metal nitride passivation layer. The metal nitride passivation may block dopant from passing from the doped semiconductor material to the blocking dielectric, and/or may block migration of contaminants to the substrate. The metal nitride passivation layer may comprise, for example, titanium nitride. The metal nitride passivation layer may be omitted if the blocking dielectric comprises an oxynitride or other material that can block migration of dopant and/or contaminants.

A pair of source/drain regions 40 are formed on opposing sides of tunnel dielectric 22. In the shown embodiment, the source/drain regions are conductively-doped regions of the semiconductor material of base 12. Regions 40 may be either n-type or p-type majority doped, depending on the transistor type (NFET or PFET) to be formed.

Example materials and thicknesses that may be utilized in the gate stack of memory cell 20 are as follows. The tunnel dielectric 22 may consist of hafnium oxide formed to an effective oxide thickness of about 2 nanometers. The nanoparticles 25 and 27 may consist of tungsten and platinum, respectively, and may be spheres having about the same diameters as one another, with an example diameter of such spheres being from about 1 nanometer (nm) to about 3 nm. The material 26 within which nanoparticles 25 and 27 are embedded may consist of silicon dioxide, and may be formed to a thickness over the uppermost surfaces of nanoparticles 25 and 27 of from about 3 nm to about 4 nm. The nanoparticles 29 may consist of tungsten, and may be spheres having a diameter from about 3 nm to about 6 nm. The material 30 within which nanoparticles 29 are embedded may consist of hafnium silicon oxynitride, and may be formed to an equivalent oxide thickness over the uppermost surfaces of nanoparticles 29 of from about 3 nm to about 5 nm. The nanoparticles 33 may consist of Pt, and may be spheres having a diameter of from about 3 nm to about 10 nm. The material 34 within which nanoparticles 33 are embedded may consist of hafnium silicon oxynitride, and may be formed to an equivalent oxide thickness over the uppermost surfaces of nanoparticles 33 of from about 2 nm to about 5 nm. The charge blocking material 36 may consist of hafnium silicon oxynitride (HfSiON), and may have an equivalent oxide thickness of from about 4 nm to about 6 nm.

Figure 2:
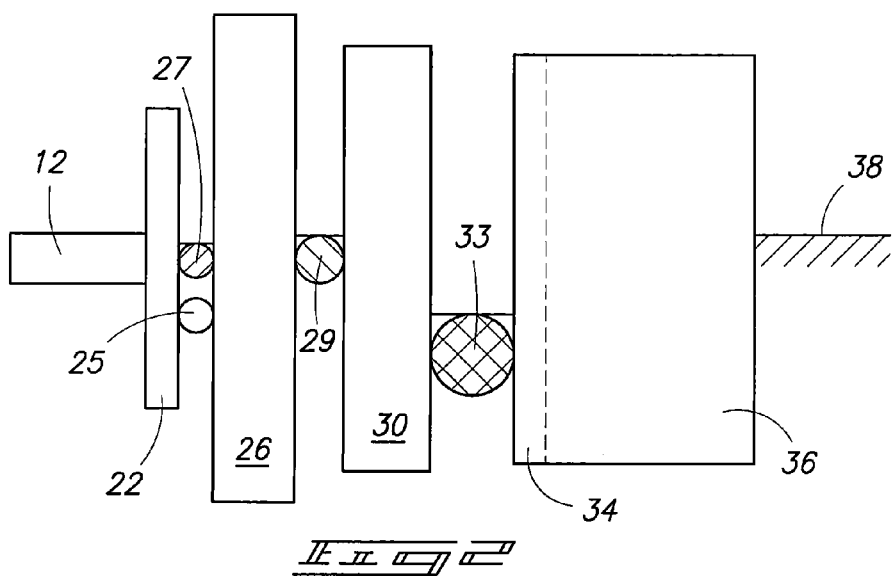
FIG. 2 is an energy band diagram of an example of the memory cell embodiment of FIG. 1.

FIG. 2 shows a band gap diagram of a specific embodiment of the memory cell of FIG. 1.

The memory cell of FIGS. 1 and 2 comprises an NVM element (which contains charge-trapping zones 28 and 32) and a DRAM element (which contains charge-trapping zone 24). The DRAM element and NVM element may be independently operated as MLC-type devices. Alternatively, both the DRAM and NVM elements may be independently operated or coupled as SLC-type devices.

FIG. 3 illustrates programming operations for the DRAM element. The DRAM element comprises the charge-trapping zone 24. The charge-trapping zone 24 is shown in isolation from the rest of memory cell 20 (FIG. 1) in FIG. 3 to simplify the drawing.

The charge-trapping zone 24 contains the plane of nanoparticles 25 and 27. The nanoparticles 25 are a first type of nanoparticles having a first work function, and the nanoparticles 27 are a second type of nanoparticles having a second work function. The second work function has a lower absolute value of potential energy than the first work function (see FIG. 2 for the relative depths of the potential energy wells of particles 25 and 27). Accordingly, the nanoparticles 25 have a greater trapping depth than the nanoparticles 27.

Initially, a first programming voltage is imposed at the gate of memory device 20 (FIG. 1). Such creates a planar "coulomb blockade" at the first programming voltage, and selectively charges the deeper traps of nanoparticles 25 relative to the shallower traps of nanoparticles 27. This creates the memory state 10.

Once the deeper traps of nanoparticles 25 are filled, the shallow traps of nanoparticles 27 can fill to achieve the memory state 11. The filling of the shallow traps may be accomplished by either increasing a programming voltage beyond that utilized to achieve memory state 10, or by increasing the amount of time that the memory cell is exposed to the programming voltage so that both the deep traps of nanoparticles 25 and the shallow traps of nanoparticles 27 are charged.

If the polarity of voltage is reversed from the charging voltage, the memory cell will begin to erase. The shallow traps of nanoparticles 25 will erase first to create the memory state 01 due to lower barrier energy of the charged carriers. If the erasing voltage is continued and/or increased, the deep traps of nanoparticles 27 will also erase to create the memory state 00.

The utilization of tunnel dielectric comprising hafnium oxide may enable the tunnel dielectric to have a low barrier height, and to be a thin barrier when a field is imposed on the high-k material of the dielectric. A direct tunneling mode of electron transport through the tunnel dielectric and into the DRAM charge-trapping zone may occur. This may enable many orders of magnitude of increased electron current relative to tunneling across a similar thickness of silicon dioxide. Such can approach a high programming speed for some embodiments of the invention. Similar transport may take place when holes tunnel during erase due to barrier thinning and direct tunneling (although the speed of holes may be slower than the speed of electrons due to a higher barrier height faced by holes relative to the barrier height faced by electrons).

The programming of FIG. 3 is described as proceeding sequentially through memory states 10, 11, 01 and 00. In other embodiments, sufficient voltage may be applied to reach memory state 11 without proceeding through a stop at memory state 10, and/or to reach memory state 00 without proceeding through a stop at memory state 01. This may also provide SLC operability, if such is desired.

FIG. 4 illustrates programming operations for the NVM element. The NVM element comprises the charge-trapping zones 28 and 32. The charge-trapping zones 28 and 32 are shown in isolation from the rest of memory cell 20 (FIG. 1) in FIG. 4 to simplify the drawing.

The charge-trapping zone 28 contains the plane of nanoparticles 29, and the charge-trapping zone 32 contains the plane of nanoparticles 33. In this embodiment, the nanoparticles 33 have deeper traps than the nanoparticles 29, and are placed a larger distance from the silicon substrate.

Initially, sufficient programming voltage is applied to charge traps associated with nanoparticles 29 of charge-trapping zone 28, and to thereby form the memory state 10. The charging of charge-trapping zone 28 comprises injection of electrons through dielectric materials 22 and 26 (FIG. 1).

A higher programming voltage may then be applied to charge traps associated with nanoparticles 33 of charge-trapping zone 32, to thereby form the memory state 11. The charging of charge-trapping zone 32 comprises injection of electrons through dielectric materials 22, 26 and 30 (FIG. 1). The combination of dielectric materials 22, 26 and 30 may form a crested barrier in embodiments in which dielectric material 30 has a much larger dielectric constant than dielectric material 26. This may lead to barrier thinning, and enhanced charge transport. Further, coulomb blocking created by charge trapping zones 24 and 28 aids in establishing preferred energy states for tunneling, thereby reducing threshold voltage dispersion.

If the polarity of voltage is reversed from the charging voltage, the memory cell will begin to erase. The erasing voltage may be applied at a first level which reduces electron charge on nanoparticles 29 to form memory state 01.

Subsequently, the erasing voltage may be raised to a second level which removes electron charge from nanoparticles 33 to form memory state 00.

The programming of FIG. 4 is described as proceeding sequentially through memory states 10, 11, 01 and 00. In other embodiments, sufficient voltage may be applied to reach memory state 11 without proceeding through a stop at memory state 10, and/or to reach memory state 00 without proceeding through a stop at memory state 01.

In some embodiments, the programming of the NVM element may alter the memory state of the DRAM element. For instance, if the DRAM element is not in a fully-charged state during charging of a charge-trapping zone of the NVM element, the DRAM element may be shifted to such fully-charged state during the programming of the NVM element. In some embodiments, it may be acceptable to lose data from DRAM elements of individual memory cells during programming of the NVM elements of the individual memory cells. In other embodiments, it may be desired to backup the data of DRAM elements of first memory cells onto DRAM or NVM elements of second memory cells prior to programming of the NVM elements of the first memory cells. After the NVM elements of the first memory cells are programmed, the data may be written from the second memory elements back to the DRAM of the first memory elements. By appropriately sequencing reading and programming, DRAM states, if altered during programming of the NVM element, can be restored.

The DRAM and NVM elements of the memory cells of FIGS. 1-4 are shown as MLC-type devices storing two data bits. In other embodiments, one or both of the DRAM or NVM elements may be an SLC-type device. In yet other embodiments, more types of nanoparticles may be included in the DRAM and/or NVM elements so that the DRAM and/or NVM elements are MLC-type devices that can store more than two data bits.

The DRAM and NVM elements of the memory cells of FIGS. 1-4 are described as working in a "normal" mode in which charge is injected from a silicon substrate through a tunnel dielectric to the charge-trapping zones. In some embodiments, one or both of the DRAM and NVM elements may work in a "reverse" mode in which charge is injected from the control gate through appropriate dielectric layers to the charge-trapping zones. In yet other embodiments, one or both of the DRAM and NVM elements may be asymmetric so that some charge is injected in a "normal" mode and some in a "reverse" mode.

The memory cells discussed above may be utilized in electronic systems, such as, for example, cars, telephones, computers, cameras, video recorders, televisions, airplanes, etc.

Figure 5:
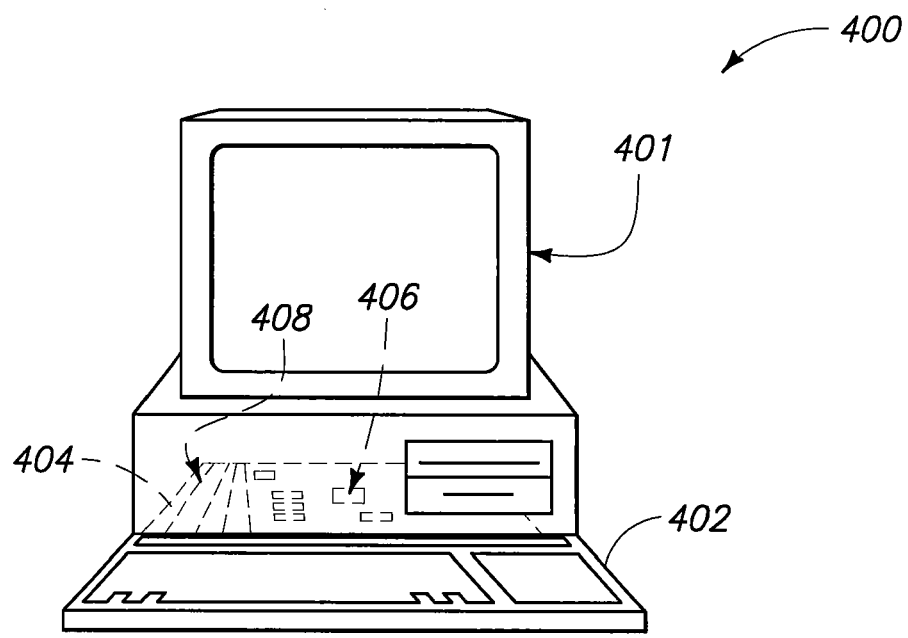
FIG. 5 is a diagrammatic view of a computer embodiment.
Figure 6:
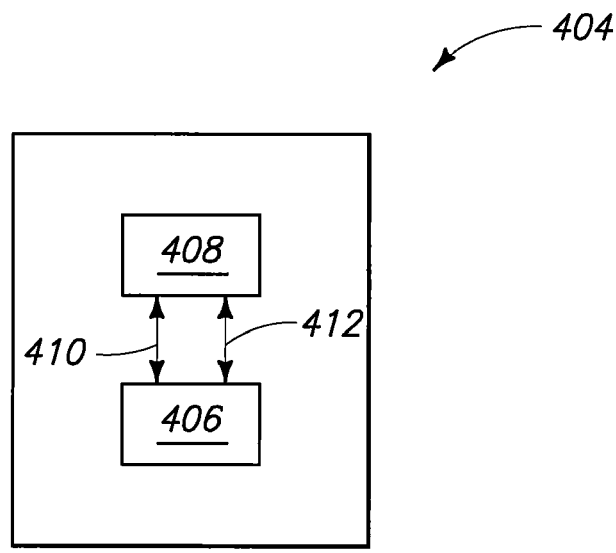
FIG. 6 is a block diagram showing particular features of the motherboard of the FIG. 5 computer embodiment.
Figure 7:
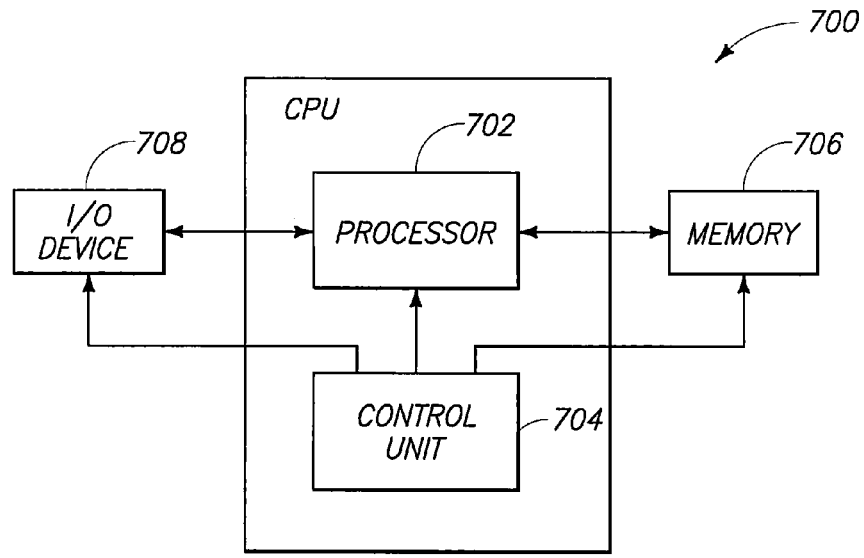

FIG. 5 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 6. In such block diagram, the addressing circuitry is illustrated as 410 and the read circuitry is illustrated as 412.

Processor device 406 may correspond to a processor module, and associated memory utilized with the module may comprise may comprise memory cells of the type described with reference to FIGS. 1-4. The processor device and associated memory may be formed in a single integrated circuit chip.

Memory device 408 may correspond to a memory module, and may comprise memory cells of the type described with reference to FIGS. 1-4. The memory device 408 may be on one integrated circuit chip and the processor device on a separate integrated circuit chip. For instance, the memory device 408 may be a memory card.

Figure 7:
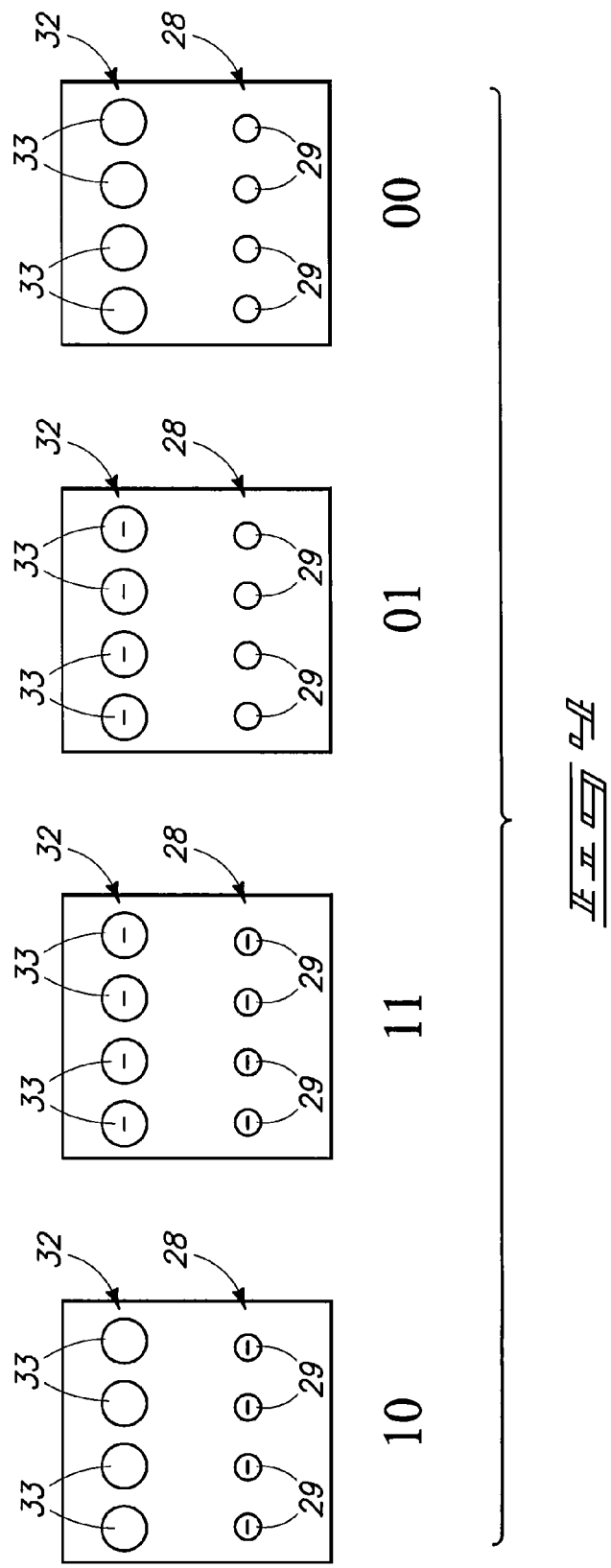
FIG. 7 is a high level block diagram of an electronic system embodiment.

FIG. 7 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may comprise memory cells of the type described with reference to FIGS. 1-4.

Figure 8:
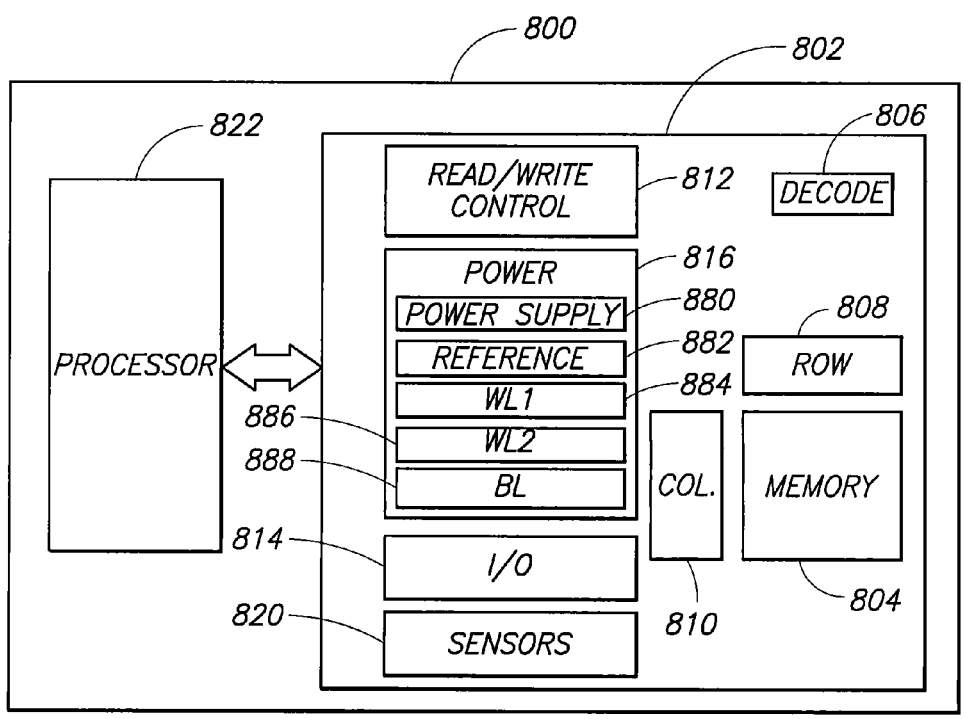
FIG. 8 is a simplified block diagram of a memory device embodiment.

FIG. 8 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O ines. At least one of the processor 822 or memory device 802 may include memory cells of the type described with reference to FIGS. 1-4.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

Additional aspects and applications of some embodiments are described with reference to FIGS. 9-19.

As introduction to the additional aspects, computers, cell phones and many other hand-held devices employ several types of memories including ROM or PROM, DRAM and Non-Volatile Floating-gate NOR/NAND Flash for working memories and instruction and data store. Floating-gate Multi-level-Cell (MLC) NAND Flash technology has been in the forefront in recent years providing low-cost, low power memory solutions especially for a wide variety of hand-held devices. All the above memories may utilize custom technologies not compatible with each other due to different cell design and characteristics and consequently produced on different silicon substrates to minimize cost and maximize product yield. Both DRAM and floating-gate FLASH may consume high power, the former due to the requirement of frequent refreshing to maintain the data integrity, and the later due to the requirement of on-chip high voltage/current (tunneling/channel effects) for programming and erase. Furthermore, there may exist serious scalability concerns for both DRAM (capacitor scalability problems) and floating-gate FLASH (voltage and coupling noise scalability problems) for implementation into future technology generations. Additionally, with progressive scaling of feature size, fundamental device leakage issues (for instance, short-channel effects and gate-dielectric leakage) may need to be contained to take advantages of scaling. The inventor has proposed ideas based on direct tunnel memories and SGT-based devices to provide multiple functionality of arrays covering ROM, DRAM, and FLASH functionalities by appropriately altering the tunneling distance for such devices thereby providing varying degree of non-volatility and programming speed. Additionally, the inventor has proposed the concepts of DRAM applications and of UNIVERSAL MEMORY based on Discrete Trap (DT) (SONOS-type) devices whereby many orders of magnitude higher programming speed could be achieved by replacing $SiO_2$ tunneling dielectric by multiple layers of appropriate higher K dielectric to simultaneously achieve barrier lowering and barrier thinning. This improves forward transport of carriers by many orders of magnitude compared to those through $SiO_2$. Simultaneously, required charge retention greater than 10 years may be achieved by reducing back tunneling of trapped charges by 5-6 orders of magnitude from that of $SiO_2$ by introducing asymmetry in both barrier energy and tunneling distance during the standby state of the memory.

Unlike DT (SONOS-type) memories where charges are stored in defects created in bulk insulators, Embedded Trap (ET) nanocrystal memories store charges in defects associated with silicon, or germanium or metal nanocrystals embedded in oxide or other appropriate relatively trap-free insulators. For nanocrystal device types, Ge or Si—Ge nanocrystals embedded in HfAlO dielectric may demonstrate significantly improved retention over silicon-nanocrystal and other metal nanocrystals by providing deeper trapping energy. It is observed that defects associated with higher work-function (WF) metal nanocrystals provide deeper traps and consequently such devices exhibit improved retention. Both DT and ET devices have advantages over silicon floating gate devices for NVM (nonvolatile memory) applications since these may require approximately half the tunnel-oxide thickness for charge retention for 10 years (~4 nm tunnel-oxide compared to ~8 nm tunnel-oxide for Si floating gate device). These devices, in general, also exhibit higher programming speed and endurance. When compared with the SONOS type of DT devices, the nanocrystal ET type devices have two potential advantages: 1) improved endurance and 2) reduced threshold voltage (VT) dispersion. For MLC operation, a larger VT-window is desired. The inventor has disclosed ET devices for MLC applications which simultaneously provide large VT-window, reduced VT dispersion and voltage scalability.

The present disclosure provides a nanocrystal MLC device which integrates within the same cell functionality features of DRAM and NVM, thus providing a universal memory within the context of MLC operation, and yet also improving the memory density at the same time. Examples of two-bit per cell (four stable states) for both DRAM and NVM operations and DRAM/NVM operations are provided. Further refinement could potentially extend such devices to higher MLC levels (e.g. three-bit per cell with eight stable states). This device concept may integrate various combinations of numerous disclosed features.

One of the features of some embodiments is that DRAM elements consisting of band-engineered tunneling dielectric layers may provide very high electron (or hole) current during writing and erasing to achieve writing and erasing speed of nanoseconds. While such carrier transport is achieved by direct tunneling, deeper traps and asymmetric barriers reduce charge losses by back-tunneling and retains memory up to thousands of seconds. The DRAM element may provide multiple storage states for two-bit per cell operation (four levels) with very small VT-dispersion per states. The DRAM element operates at lower programming voltage levels and physically closer to the silicon-insulator interface. The DRAM elements are designed to provide high endurance.

Another feature of some embodiments is that NVM elements may consist of multi-planar stacks of nanocrystal planes separated by larger tunneling distance and an insulator with higher energy barrier to prevent charge penetration deeper into the stack during DRAM operations and to provide relative isolation between the two elements. The NVM elements may consist of planes of nanocrystals containing progressively deeper traps (higher work-function metal nanocrystals), progressively larger nanocrystal sizes to reduce quantum confinement and improve retention, and planes separated at progressively larger physical distances for achieving distinct and multiple stable states with low VT-dispersion (by taking advantage of "Planar Coulomb blockade") for MLC operation. The NVM elements could emulate the DRAM devices by appropriate programming at desired intervals (refreshing) for permanent data storage when such is desired. Alternately, the NVM element could operate as non-volatile MLC memory only.

Another feature of some embodiments is that a device gate stack equivalent oxide thickness (EOT) may be scaled by appropriate selection of high K charge blocking layers for programming voltage scaling.

Yet another feature of some embodiments is that a device as stated above may operate as a "Normal" mode device. By reversing the stack configuration, the device could potentially operate in a "Reverse" mode.

Yet another feature of some embodiments is that the programming of the DRAM memory states may involve electron transport at relatively low voltage levels across the low bandgap "direct-tunnel" insulator interfacing the silicon substrate. For SLC operation, trapping and detrapping of electrons are associated with an appropriate single type of nanocrystal trapping center. For MLC operation, two types of nanocrystals with significantly different work-functions and associated trap depths are employed. This results in trap filling and trap emptying at distinctly different voltage levels associated with the different nanocrystals. Programming the DRAM memory states could be achieved either independently to those of non-volatile memory states or in conjunction with those of the non-volatile memory states.

Yet another of feature of some embodiments is that the programming the nonvolatile (NV) memory states may involve electron transport at relatively higher voltage levels (due to Fowler-Nordheim tunneling) at larger tunnel distances and subsequent trapping at appropriate nanocrystal traps. For SLC NV operation, a single type of nanocrystal trapping center is employed. For MLC operation, multi-planar trapping centers with single or multiple types of nanocrystals with different work-functions may be employed. By selecting and optimizing a) tunnel distances, b) trap densities (nanocrystal size and distribution) and c) trap depths (nanocrystal types of different work-functions), programming of multiple states and associated threshold windows could be obtained. Programming of NV memory states could be achieved independently to those of the DRAM memory states or in conjunction with the DRAM memory states. However, programming of NV memory states may affect the DRAM states and therefore, may require restoring the DRAM states by an appropriate programming sequence. This is explained in more detail below for both the "Normal" and "Reverse" mode of NV memory operations.

Some specific details of some embodiments are next discussed.

Normal Mode Operation

Figure 11:
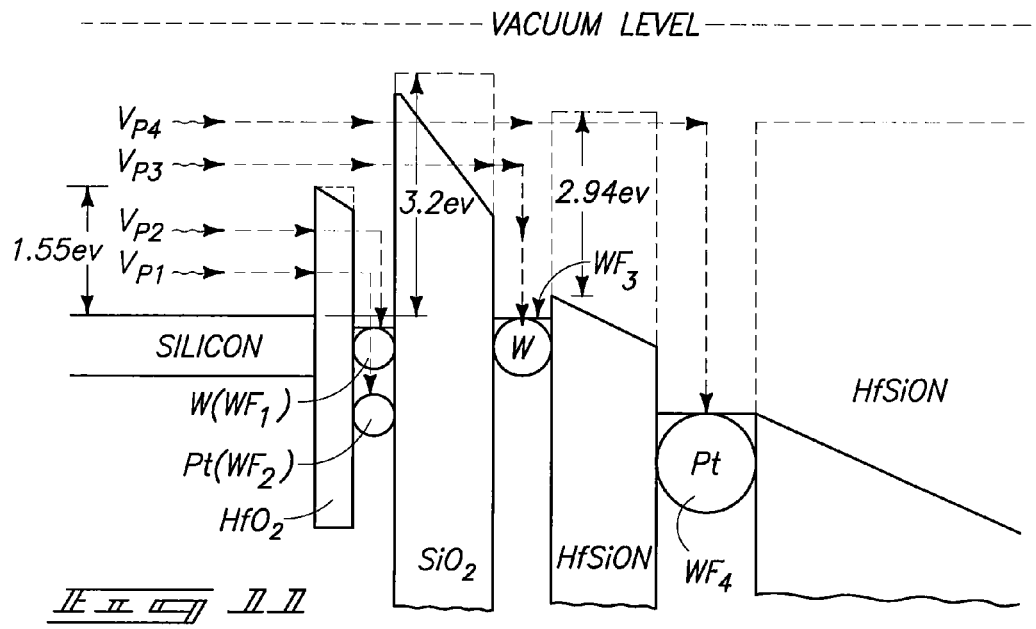

FIGS. 9-11 describe a generalized band diagram to obtain the key elements and features of an embodiment. FIG. 9 is the band diagram for the entire gate stack at zero gate bias. FIG. 10 is the corresponding enlarged band diagram for the tunnel dielectric regions identifying the DRAM elements as well as NVRAM elements. FIG. 11 shows the band diagram to illustrate band bending and charge transport during writing when an appropriate bias of $V_{p4}$ is imposed on the gate.

As shown in FIG. 9, there are at least four relatively trap-free dielectric regions $I_1$-$I_4$, with thickness $t_1$, $t_2$, $t_3$ and $t_4$, and at least three nanocrystal planes $p_1$, $p_2$ and $p_3$ between the silicon substrate and the gate. The dielectric regions $I_1$, $I_2$, $I_3$, and $I_4$ consist of materials with dielectric constants $K_1$, $K_2$, $K_3$ and $K_4$ with corresponding energy barriers to electrons and holes being: $X_{1e}/X_{1h}$, $X_{2e}/X_{2h}$, $X_{3e}/X_{3h}$ and $X_{4e}/X_{4h}$ respectively. The three nanocrystal trapping planes contain embedded nanocrystals of diameters $D_1$ and $D_2$ both embedded in $K_2$ in $p_1$; whereas $D_3$ and $D_4$ are embedded respectively in dielectric layers $K_3$ and $K_4$ for planes $p_2$ and $p_3$.

Plane $p_1$ contains two different nanocrystals $N_1$ and $N_2$ with different work functions: $WF_1$ and $WF_2$. The nanocrystals $N_1$ and $N_2$ both could be approximately same diameter. Plane $p_2$ contains nanocrystals with diameter $D_3$, while plane $p_3$ contains nanocrystals with diameter $D_4$; with respective work functions of the nanocrystals in $p_3$ and $p_4$ being $WF_3$ and $WF_4$. Not shown are lateral separation of nanocrystals in any of the planes which should be in the order of ~3.5 nm-4 nm to minimize lateral charge migration due to direct tunneling. As shown in FIG. 9 qualitatively, the relationship between various elements discussed above are as follows: dielectric materials $t_1 < t_2 < t_3 < t_4$, where $t_1$ is less than or equal to about 2 nm; $X_{1e} < X_{3e} \leq X_{4e} < X_{2e}$, where $X_{1e}$~1.5 ev and $X_{2e}$>3 ev; and $K_1 \geq K_3 \geq K_4$ and $K_2 << K_1$, whereby $K_2$~4 to 9. The nanocrystal materials $D_1 = D_2 < D_3 < D_4$, where $D_1$~$D_2$ may range between 1-2 nm; and the workfunctions are $WF_1 << WF_2$ where $WF_1$~4.0-4.2 ev, and $WF_3 << WF_4$ where $WF_3$~4.0-4.6 ev. The energy barriers to the holes may be $X_{1h} \leq X_{2h} \leq X_{3h} \leq X_{4h}$, where $X_{1h}$>3 ev.

FIG. 10 shows an enlarged view of the tunneling regions identifying the DRAM elements and the NVM elements.

For MLC-DRAM operation, electron transport to the trapping nanocrystal plane $p_1$ is established preferentially at two distinct voltage levels consistent to the trap depths of $N_1$ and $N_2$ of $WF_1$ and $WF_2$ respectively. Due to the lower barrier height of $I_1$ and barrier thinning $t_1$ resulting from a high value of $K_1$ (when a field is imposed during programming) coupled with direct tunneling mode of electron transport, many orders of magnitude increased electron current is established compared to tunneling across similar thickness of $SiO_2$, which may lead to a very high programming speed. Similarly, reverse transport of electrons takes place during erase due to barrier thinning and direct tunneling (although the speed may be slower due to higher barrier height).

Electrons first get filled at the deeper trap levels defined by $WF_2$ to provide Memory State 10 (DRAM) when the first programming voltage $V_{p1}$ is imposed at the gate. This creates planer "coulomb blockade" at the first programming voltage level $V_{p1}$. When the programming voltage is raised to $V_{p2}$, electrons are transported again rapidly to fill the trap levels defined by $WF_1$ which defines Memory State 11 (DRAM). During Erase, at $V_{e1}$ (polarity reversed) the process is reversed, since first the trap levels defined by $WF_1$ is emptied of trapped carriers by direct tunneling at lower energy level (lower $V_{erase}$), establishing Memory State 01 (DRAM). Subsequently, with increased value of $V_{erase}$ at $V_{e2}$, all electronic charges are removed and the most negative Memory State 00 (DRAM) is achieved. Due to well-defined quantum confinement of carriers and planar coulomb blockade, VT-dispersion (threshold voltage dispersion) for each level is suppressed.

Electron transport and trapping for DRAM memory states 10 and 11 are schematically shown in FIG. 11 corresponding to $V_{p1}$ and $V_{p2}$. High barrier energy associated with $I_2$ ($X_{2e}$) compounded by planar coulomb blockade prevents electron transport beyond the DRAM elements (even at $V_{p2}$ level), thereby providing relative isolation between DRAM elements and NVRAM elements. Retention for DRAM memory is expected to be greater than 100 seconds.

For NVRAM Memory Operation, programming voltage level is increased significantly before charge filling is initiated in the $p_2$ nanocrystal plane. This is to overcome the high energy barrier of $I_2$. At the voltage of $V_{p3}$, charges are rapidly transported and trapped in $p_2$ associated with nanocrystals $N_3$. At still higher voltage level $V_{p4}$, once the $p_2$ plane is filled, electrons gets transported and trapped in $p_3$ associated with nanocrystals $N_4$. It is noted that the electron barrier energy of $I_3$: $X_{3e}$, is lower than that of $I_2$: $X_{2e}$. The combination of $I_1$, $I_2$ and $I_3$ forms a crested barrier, and since $K_3 >> K_2$, this leads to barrier thinning. As a result, enhanced charge transport takes place for MLC-NVM operation. Simultaneously, quantum confinements and coulomb blockade aids in reducing VT-dispersion. Independent of DRAM operation, VT shift in trap-filling in $p_2$ defines 10 (NVM) memory state and the VT shift in trap-filling in $p_3$ defines 11 (NVM) memory state. Furthermore, during the erase process, when $V_{e3}$ is reached, electrons tunnel back to the substrate from $p_2$ establishing the 01 (NVM) memory state. Electron transport and trapping for NVM memory states: 10 and 11 are schematically shown in FIG. 11 corresponding to $V_{p3}$ and $V_{p4}$. When erase voltage is further increased to remove all electrons from the $p_3$ trapping sites (at $V_{e4}$), the device returns to the 00 (NVM) memory state which is also the same state for the DRAM memory elements. Due to the asymmetric energy barriers and longer tunnel distances, charge retention may be in excess of 10 years. The well-defined charge centroids of the planar charge storages of the $p_2$ and $p_3$ planes may provide enhanced endurance for such a device. Since the device programs and erases at reduced field across the various dielectric layers, the device may provide enhanced reliability.

For Universal Memory Operation, the DRAM memory states may be replicated into the corresponding NVM memory states by first reading the DRAM state of the cell and programming that state in the NVM mode. Subsequently, the NVM memory state may be addressed and verified and the DRAM state can be replicated back. This can be done periodically at much reduced power than conventional DRAM refreshing. Since the DRAM state is preserved for permanency into the NVM state, no data is lost even when the power is lost. Thus the device works as an universal memory while providing MLC operation; and may provide a potentially high density (cell density $\sim 2F^2$, where "F" is a minimum feature size of a process), low-power universal memory solution.

FIG. 11 corresponds to the band diagram of a specific embodiment of the above device. The dielectric layers $I_1$ and $I_2$ are respectively $HfO_2$ ($E_b$=5.7 ev, $t_1$=1-2 nm, $X_{1e}$=1.55 ev, $K_1$=24), and $SiO_2$ ($E_b$=9 ev, $t_2$=3-4 nm, $X_{2e}$=3.2 ev, $K_2$=3.9). The dielectric layers $I_3$ and $I_4$ are HfSiON ($E_b$=6.9 ev, $t_3$=4-5 nm, $t_4$=40 nm, $X_{3e}$=$X_{4e}$=2.92 ev, $K_3$=$K_4$=17). Total EOT of the stack would be around ~15 nm and $V_{p4}/V_{e4}$ would be around 15v, 1 msec, while the other NVM mode programming voltage level is estimated to be $V_{p3}/V_{e3}$ of about 12v. The DRAM voltage levels would depend on the speed/window trade offs ranging from estimated about 4 volts (slower, on the order of microseconds) to about 7.0 volts (faster, on the order of nanoseconds) for $V_{p1}/V_{e1}$; and estimated to be about 6.0 volt (slower, on the order of microseconds) to about 9.0 volt (faster, on the order of nanoseconds) for $V_{p2}/V_{e2}$.

All of the above programming voltage levels could be reduced by 2-3 volts with corresponding reduction of EOT by replacing $I_2$ layer of $SiO_2$ by $Al_2O_3$ ($E_b$=8.7 ev, $X_{2e}$=2.75 ev, $K_2$=9.0).

The nanocrystals shown in FIG. 11 are respectively W ($WF_1$=4.6 ev), Pt ($WF_2$=5.3 ev), W ($WF_3$=4.6 ev) and Pt ($WF_4$=5.3 ev) for $N_1$, $N_2$, $N_3$ and $N_4$. However, $N_1$ and $N_3$ could also be either Au ($WF_1$=4.2 ev) or Ge/Ge—Si ($WF_1$=4.0 ev), while $N_2$ and $N_4$ could be either Ir ($WF_2$=$WF_4$=5.3 ev) or Ru ($WF_2$=$WF_4$=5.0 ev).

Further reduction of EOT and programming voltage levels could be accomplished by judicious selection of higher K insulators for $I_3$ and $I_4$. For example, a combination of $HfO_2$ as $I_1$, $Al_2O_3$ as $I_2$, $La_2O_3$ or $Pr_2O_3$ (K~30) as $I_3$ and $LaAlO_3$ (K~27.5) could reduce the stack EOT to 7 nm. Consequently, all voltage levels could be scaled by a factor of about two.

Figure 12:
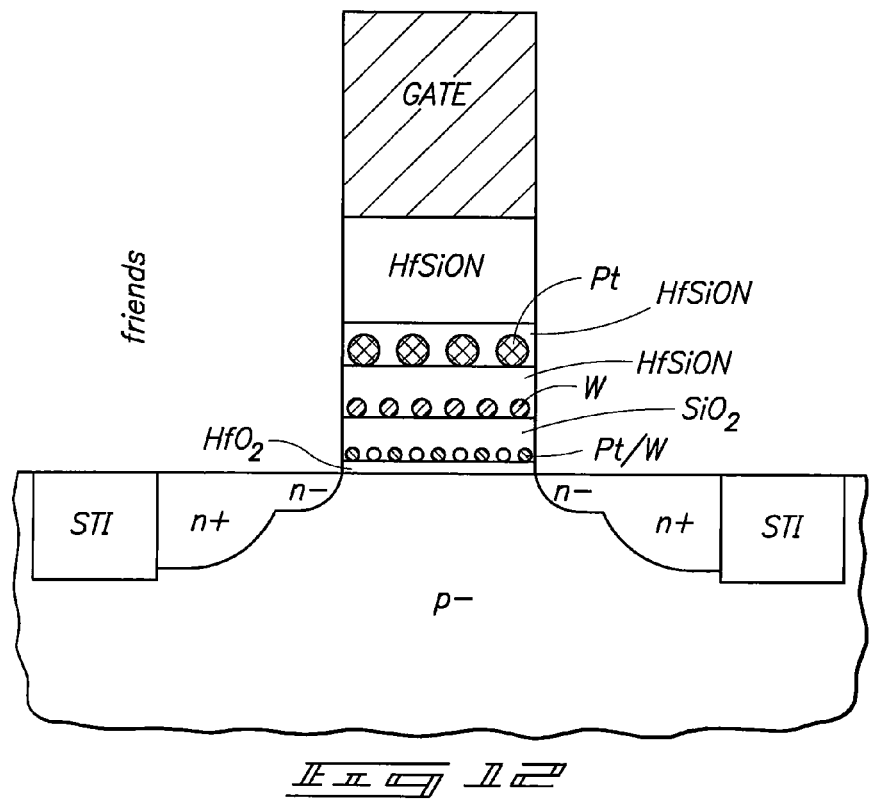
FIG. 12 is a diagrammatic, cross-sectional view of a portion of a semiconductor construction illustrating an embodiment of a memory cell.
Figure 11:
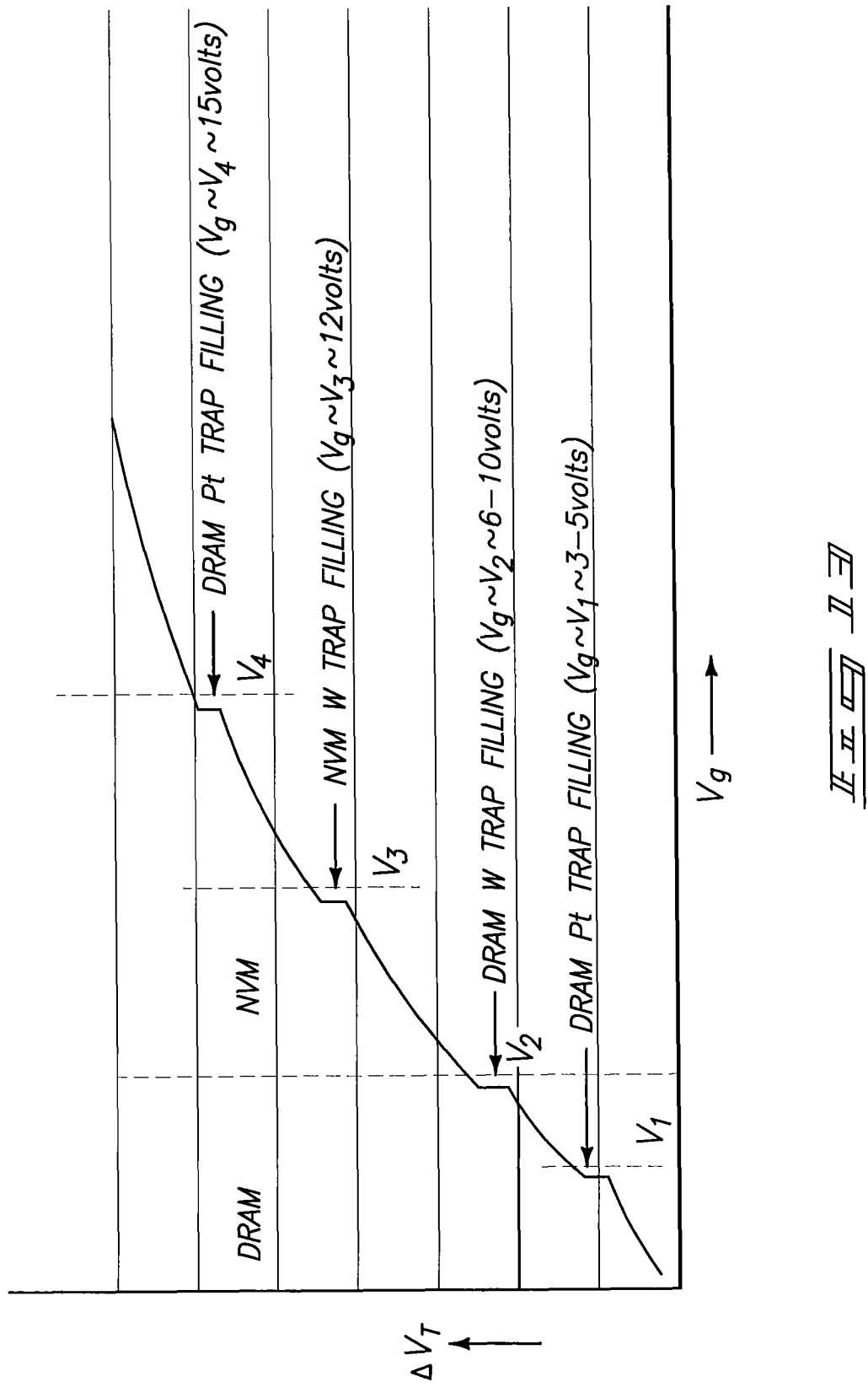

FIG. 12 shows a schematic of a gate stack structure corresponding to the band diagram as exemplified in FIG. 11, with a direct tunnel insulator $HfO_2$ interfacing a background p-type doped (in other words, p-doped) silicon substrate. Nanocrystals $N_1$ ($WF_1$) and $N_2$ ($WF_2$) are tungsten and platinum respectively and are embedded in $I_2$ which corresponds to $SiO_2$ with a bandgap of 9 ev. Both $I_3$ and $I_4$ are HfSiON layers embedding tungsten and platinum nanocrystals, respectively, with increasingly larger diameter and greater charge retention. The charge blocking layer HfSiON also provides interface passivation as well as higher thermal stability for ease of stack integration with the conventional n+ doped polysilicon gate. Additionally, it also provides electron barrier energy>2.9 ev at the gate interface, thereby eliminating the potential requirement of interface metallic layer such as TiN or TaN to prevent unwanted back-injection of carriers during erase operation. Shallow trench isolation (STI) is shown adjacent n-type doped source/drain regions.

FIG. 13 shows the estimated VT levels for the DRAM/NVM-MLC device corresponding to the band diagram of FIG. 11.

Reverse Mode Operation

Figure 15:
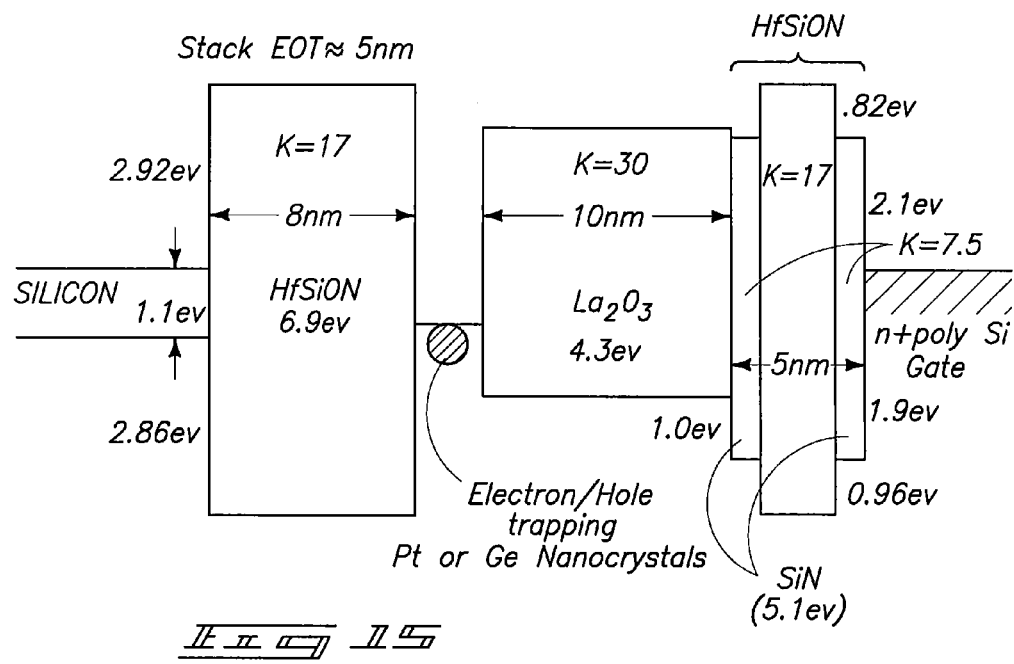
FIG. 15 is an energy band diagram of an example of the memory cell embodiment of FIG. 14.

FIG. 14 shows a schematic gate stack cross section of a reverse mode nanocrystal NOR-NVM device. A corresponding band diagram for such a device is shown in FIG. 15. In reverse mode NV devices, active carrier injection takes place from the gate during programming, while the silicon substrate remains passive due to the high interface energy barrier of a large bandgap insulator at the interface. The device shown in FIG. 14 comprises:
(a) a composite tunnel dielectric of SiN/HfSiON/SiN at the gate interface forming a crested barrier to enhance Fowler-Nordheim tunneling of carriers during programming; (b) a lower bandgap "trap-free" insulator such as $La_2O_3$ ($E_b$=4.3 ev) for an enhanced charge transport medium and embedding high work-function metal nanocrystal such as platinum at the substrate-end to provide high density deep energy charge trapping centers; and c) a large bandgap charge blocking insulator such as HfSiON (alternately, $SiO_2$ or $Al_2O_3$) interfacing a silicon substrate. Writing involves electron injection from the gate and trapping in platinum nanocrystals when a negative potential is imposed on the gate. Erasing involves removal of electrons either by detrapping or by compensation of holes when a positive potential is imposed on the gate. Since silicon-insulator interface is passive, the device provides enhanced endurance and reliability compared to a normal mode device.

Figure 16:
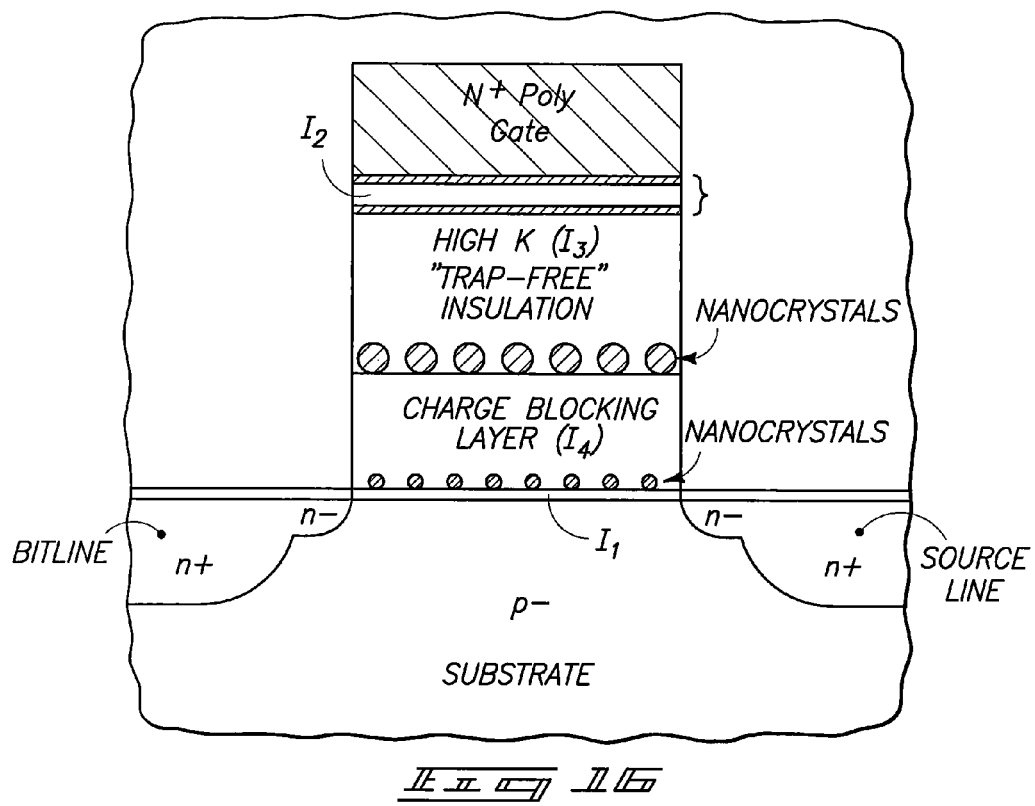
FIG. 16 is a diagrammatic, cross-sectional view of a portion of a semiconductor construction illustrating an embodiment of a memory cell.
Figure 18:
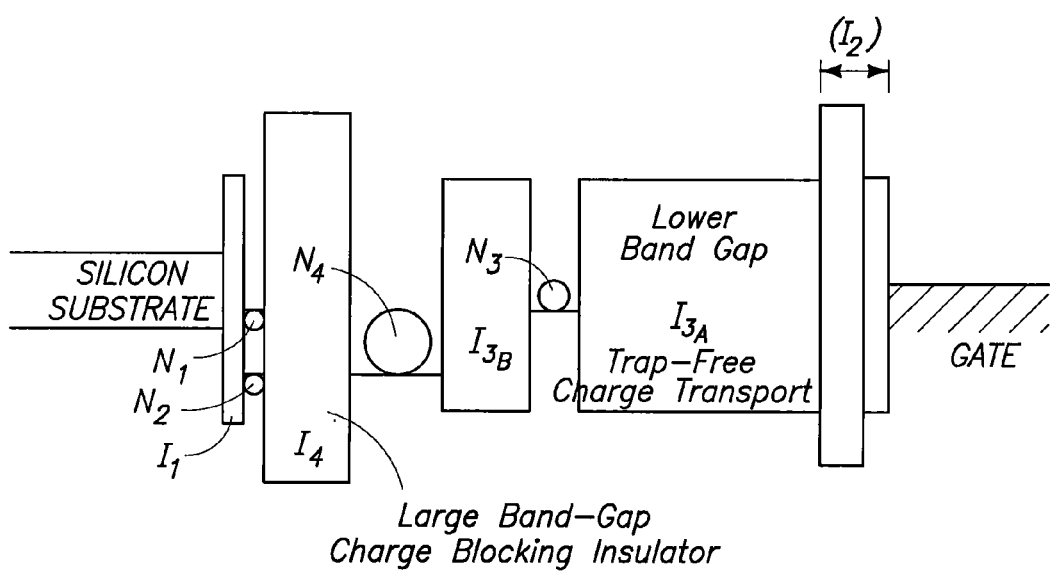
FIG. 18 is an energy band diagram of an example embodiment.
Figure 19:
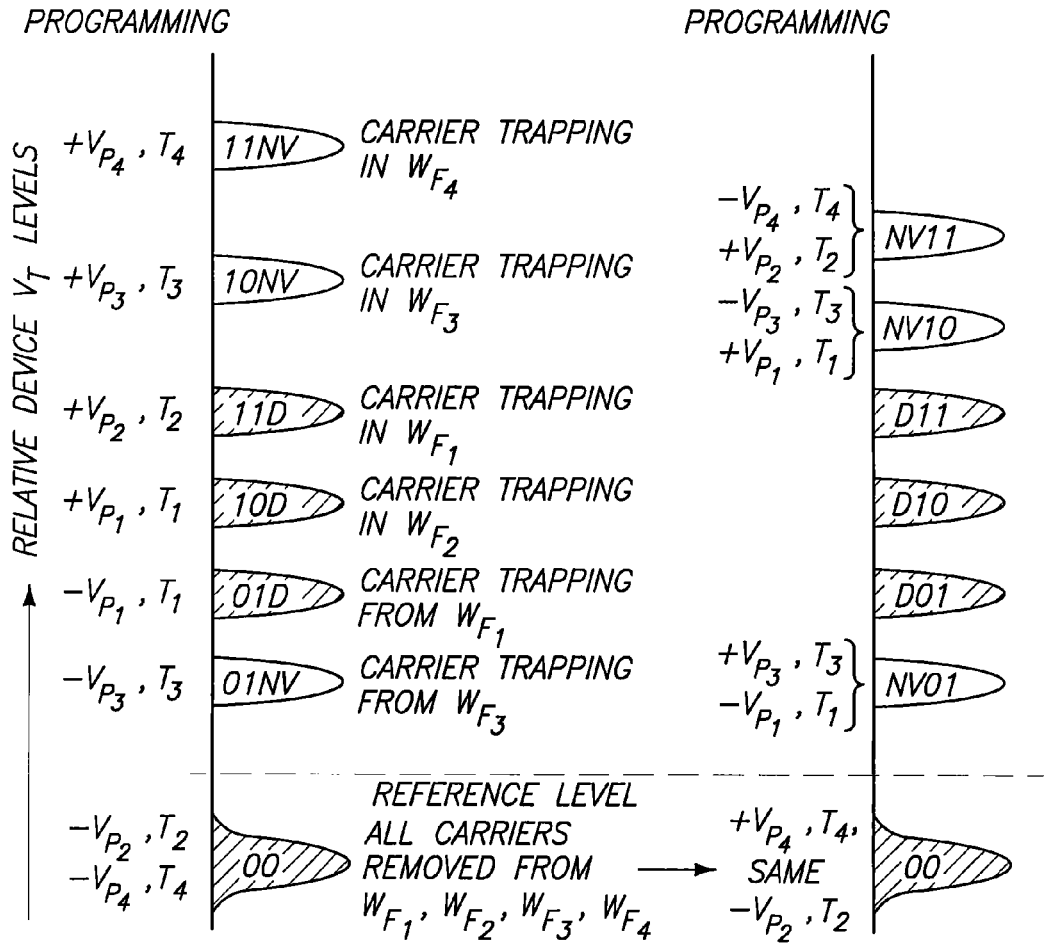
FIG. 19 diagrammatically illustrates an example method of programming a memory cell.

FIG. 16 shows a schematic cross section of a universal memory concept of an SLC cell whereby a DRAM functionality is integrated with a reverse-mode NVM device within the same gate stack. The DRAM element is similar to that shown in FIGS. 9-12 in that the charge transport is from the silicon substrate through the direct tunnel insulator interfacing the silicon substrate to the trapping centers provided by the appropriate nanocrystals. For SLC operation, only one type of nanocrystal center may be utilized (as shown); while for MLC operation, multiple nanocrystals with different work functions may be utilized (not shown) as explained earlier. Programming of the DRAM memory states would be similar to those discussed in FIGS. 9-12 as discussed before. The DRAM nanocrystal trapping centers are embedded into the charge blocking layer, $I_4$. The $I_4$ in a reverse mode device may be the largest bandgap insulator in the stack, preferably either $SiO_2$ ($E_b$=9.0 ev) or $Al_2O_3$ ($E_b$=8.7 ev), although other trap-free higher band gap insulators with high K values may also be considered (e.g. HfSiON or $LaAlO_3$). The $I_4$ prevents charge transport upward towards the gate from DRAM-trapping centers as well as charge transport downward towards the substrate from NV trapping centers acting as the charge blocking layer for both device elements by providing large barrier energy for both trapping centers. The NV trapping centers are embedded in high-K lower bandgap trap-free insulator, $I_3$, similar to those of FIG. 14. Bandgap for $I_3$ insulator may be in the range of 4 ev to 6 ev. Examples of such insulators are: $La_2O_3$ ($E_b$=4.3 ev, K=30), $Ta_2O_5$ ($E_b$=4.5 ev, K=26), $Y_2O_3$ ($E_b$=5.6 ev, K=15), $HfO_2$($E_b$=5.7 ev, K=24), SiON ($E_b$=6.0 ev, K=7), etc. For SLC-NV operation, a single plane of embedded nanocrystal may be considered as shown in FIG. 16. For MLC operation, multi-planar embedding of two types of nanocrystals of differing work-functions may be considered [e.g. $I_{3A}$ and $I_{3B}$ as shown in FIG. 18]. Crested barrier tunnel layer composite may consist of $HfO_2$/HfSiON/$HfO_2$ or SiON/HfSiON/SiON or SiON/HfSiON/$La_2O_3$ or $HfO_2$/HfSiON/$La_2O_3$; the last two contain $I_3$ as integrated element of the crested barrier (see FIG. 18). Other possibilities may include replacing $HfO_2$ by SiN or SRN (silicon-rich nitride) or $Ta_2O_5$ or $La_2O_3$, etc.

The nanocrystals may be tungsten, platinum or ruthenium.

Figure 17:
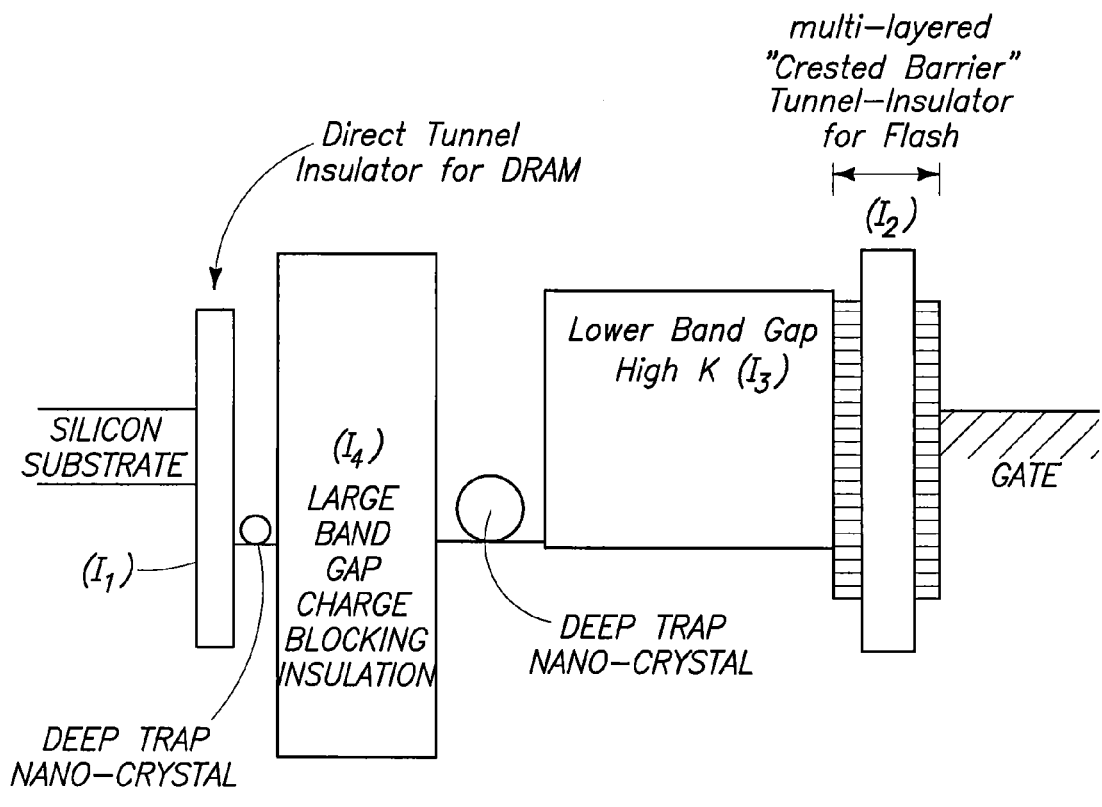
FIG. 17 is an energy band diagram of an example of the memory cell embodiment of FIG. 16.

FIG. 17 shows a generalized band diagram for an SLC device, while FIG. 18 shows the generalized band diagram for an MLC device with multi-planar trapping centers embedded in $I_3$.

MLC DRAM Operation

The device operates similar to the normal mode as explained earlier. Specifically, the DRAM states, programming voltage levels and pulse durations will be similar to the normal mode. Such programming will not significantly affect the NV states.

Universal Memory, NV Applications

Reverse mode writing and erasing for NV operations may adversely affect the DRAM states and may also alters the states of "NV-only" device. Therefore, operability for NV application may involve restoration of DRAM states simultaneously. As a result NV application and Universal memory application are indistinguishable and always coupled.

Writing in this device is accomplishes by first reading the DRAM state and then programming with a high negative bias to fill one of the two NV trapping planes followed by a positive pulse to restore the equivalent DRAM memory state. For example, if the DRAM state is the highest positive VT state, $D_{11}$, achieved by programming the DRAM element with a positive $V_2$ pulse, the NV/Universal memory state of $NV_{11}$ or $U_{11}$ is achieved by programming at the highest negative voltage $-V_4$ pulse followed by a positive $+V_2$ pulse. Similarly the intermediate high VT state, $D_{10}$ is replicated in NV/Univ element by pulsing at $-V_3$ pulse followed by $+V_1$ pulse to establish $NV_{10}$ as well as to restore $D_{10}$ memory state. For the DRAM positive low VT state of $D_{01}$, the programming involves a $+V_3$ pulse followed by a $-V_2$ pulse to establish $NV_{01}$ state as well as to restore the $D_{10}$ state. The ground state of $D_{00}$ or $NV_{00}$ is achieved by successive pulses of $+V_4$ and $-V_2$. This is summarized in FIG. 19, with times indicated by $T_1$ through $T_4$, and programming voltages indicated by $-V_{p1}$ through $-V_{p4}$, and by $+V_{p1}$ through $+V_{p4}$.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A memory cell comprising:
a first charge-trapping plane, the first charge-trapping plane comprising two different types of nanoparticles that differ in work function relative to one another, the two types of nanoparticles of the first charge-trapping plane being about the same in average maximum cross-sectional dimension as one another and being a first type of nanoparticles and a second type of nanoparticles;
a second charge-trapping plane over the first charge-trapping plane, the second charge-trapping plane comprising a third type of nanoparticles that have a third average maximum cross-sectional dimension; and
a third charge-trapping plane over the second charge-trapping plane, the third charge-trapping plane comprising a fourth type of nanoparticles that have a fourth average maximum cross-sectional dimension, the fourth average maximum cross-sectional dimension being at least about 10% greater than the third average maximum cross-sectional dimension.

2. The memory cell of claim 1 wherein one of the first and second types of nanoparticles comprises tungsten and the other comprises platinum.

3. The memory cell of claim 1 wherein the third and fourth types of nanoparticles comprise the same composition as one another.

4. The memory cell of claim 1 wherein the third and fourth types of nanoparticles comprise different compositions from one another.

5. The memory cell of claim 1 wherein one of the third and fourth types of nanoparticles comprises tungsten and the other comprises platinum.

6. The memory cell of claim 1 wherein the third type of nanoparticles comprises tungsten and the fourth type of nanoparticles comprises platinum.

7. The memory cell of claim 1 wherein the third average maximum cross-sectional dimension of the third type of nanoparticles is greater than the average maximum cross-sectional dimension of the two types of nanoparticles of the first charge-trapping plane.

8. A memory cell comprising:
a first charge-trapping plane, the first charge-trapping plane comprising two different types of nanoparticles that differ in work function relative to one another, the two types of nanoparticles of the first charge-trapping plane being about the same in average maximum cross-sectional dimension as one another and being a first type of nanoparticles and a second type of nanoparticles;
a first dielectric over and between the nanoparticles of the first charge-trapping plane;
a second charge-trapping plane over the first dielectric, the second charge-trapping plane comprising a third type of nanoparticles that have a third average maximum cross-sectional dimension;
a second dielectric over and between the third type of nanoparticles;
a third charge-trapping plane over the second dielectric, the third charge-trapping plane comprising a fourth type of nanoparticles that have a fourth average maximum cross-sectional dimension, the fourth average maximum cross-sectional dimension being at least about 10% greater than the third average maximum cross-sectional dimension;
a third dielectric over and between the fourth type of nanoparticles; and
a control gate over the third dielectric.

9. The memory cell of claim 8 wherein one of the first and second types of nanoparticles comprises tungsten and the other comprises platinum.

10. The memory cell of claim 8 wherein the third and fourth types of nanoparticles comprise the same composition as one another.

11. The memory cell of claim 8 wherein the third and fourth types of nanoparticles comprise different compositions from one another.

12. The memory cell of claim 8 wherein one of the third and fourth types of nanoparticles comprises tungsten and the other comprises platinum.

13. The memory cell of claim 8 wherein the third type of nanoparticles comprises tungsten and the fourth type of nanoparticles comprises platinum.

14. The memory cell of claim 8 wherein:
the first dielectric comprises silicon dioxide;
the second dielectric comprises one or both of hafnium silicon oxynitride and zirconium silicon oxynitride; and
the third dielectric comprises one or both of hafnium silicon oxynitride and zirconium silicon oxynitride.

15. A memory cell comprising:
a tunnel dielectric comprising one or both hafnium oxide or zirconium oxide, the tunnel dielectric being over a monocrystalline silicon base;
a first charge-trapping plane over the tunnel dielectric, the first charge-trapping plane comprising two different types of nanoparticles that differ in work function relative to one another, the two types of nanoparticles of the first charge-trapping plane being about the same in average maximum cross-sectional dimension as one another and being a first type of nanoparticles and a second type of nanoparticles;
a first dielectric over and between the nanoparticles of the first charge-trapping plane, the first dielectric layer having a first equivalent oxide thickness over the first charge-trapping plane;
a second charge-trapping plane over the first dielectric, the second charge-trapping plane comprising a third type of nanoparticles that have a third average maximum cross-sectional dimension;
a second dielectric over and between the third type of nanoparticles, the second dielectric having a second equivalent oxide thickness over the second charge-trapping plane; the second equivalent oxide thickness being at least about 10% greater than the first equivalent oxide thickness;
a third charge-trapping plane over the second dielectric, the third charge-trapping plane comprising a fourth type of nanoparticles that have a fourth average maximum cross-sectional dimension, the fourth average maximum cross-sectional dimension being at least about 10% greater than the third average maximum cross-sectional dimension;
a third dielectric over and between the fourth type of nanoparticles; and
a control gate over the third dielectric.

* * * * *